(12) United States Patent
Gough et al.

(10) Patent No.: US 7,964,878 B2
(45) Date of Patent: Jun. 21, 2011

(54) LIGHT EMITTING POLYMER DEVICES USING SELF-ASSEMBLED MONOLAYER STRUCTURES

(75) Inventors: Neil Gough, Longmont, CO (US); Jun Mo Gil, Longmont, CO (US); Wesley Thomas Walker, Boulder, CO (US); Nicolas Frederick Colaneri, Santa Barbara, CA (US); William A. Huffman, Longmont, CO (US)

(73) Assignee: HCF Partners, LP, Houston, TX (US)

( * ) Notice: Subject to any disclaimer, the term of this patent is extended or adjusted under 35 U.S.C. 154(b) by 404 days.

(21) Appl. No.: 12/268,293

(22) Filed: Nov. 10, 2008
(Under 37 CFR 1.47)

(65) Prior Publication Data
US 2010/0134052 A1 Jun. 3, 2010

Related U.S. Application Data

(63) Continuation of application No. 11/912,334, filed as application No. PCT/US2006/015984 on Apr. 27, 2006, now abandoned.

(60) Provisional application No. 60/675,131, filed on Apr. 27, 2005.

(51) Int. Cl.
| | |
|---|---|
| *H01L 27/15* | (2006.01) |
| *H01L 29/26* | (2006.01) |
| *H01L 31/12* | (2006.01) |
| *H01L 33/00* | (2006.01) |
| *H01L 29/06* | (2006.01) |
| *H01L 31/0328* | (2006.01) |
| *H01L 31/0336* | (2006.01) |
| *H01L 31/072* | (2006.01) |
| *H01L 29/08* | (2006.01) |
| *H01L 35/24* | (2006.01) |
| *H01L 51/00* | (2006.01) |
| *H01L 29/22* | (2006.01) |

(52) U.S. Cl. ............... 257/79; 257/13; 257/40; 257/94; 257/E31.064

(58) Field of Classification Search ............... 257/13, 257/40, 79, 94, E31.064
See application file for complete search history.

(56) References Cited

U.S. PATENT DOCUMENTS

| | | | | |
|---|---|---|---|---|
| 6,472,804 | B2 * | 10/2002 | Mueller et al. | 313/326 |
| 6,727,513 | B2 * | 4/2004 | Ishida et al. | 257/12 |
| 6,878,468 | B2 * | 4/2005 | Lee et al. | 428/690 |
| 7,217,334 | B2 * | 5/2007 | Toyoda | 156/230 |
| 7,329,986 | B2 * | 2/2008 | Stegamat | 313/512 |
| 7,368,377 | B2 * | 5/2008 | Whelan et al. | 438/643 |
| 7,737,437 | B2 * | 6/2010 | Yamazaki et al. | 257/40 |
| 2004/0214039 | A1 * | 10/2004 | Mackenzie et al. | 428/690 |
| 2005/0285101 | A1 * | 12/2005 | Hanson et al. | 257/40 |
| 2007/0063640 | A1 * | 3/2007 | Duineveld et al. | 313/506 |
| 2007/0278478 | A1 * | 12/2007 | Zaumseil et al. | 257/40 |
| 2009/0224657 | A1 * | 9/2009 | Marks et al. | 313/504 |

* cited by examiner

*Primary Examiner* — Ida M Soward
(74) *Attorney, Agent, or Firm* — Arnold & Knobloch, L.L.P.

(57) ABSTRACT

A light emitting device comprising a transparent substrate; a layer of conducting material in contact with the transparent substrate; a self-assembled monolayer bonded to the layer of conducting material; one or more light emitting polymer layers in electron contact to the self-assembled monolayer; and a reflective metal layer in electron contact with the light emitting polymer layer is provided. The light emitting device provided gives enhanced performance as compared to currently available devices. Also provided is a self-assembled monolayer having the formula: $R^2-R^3-Y$ where Y is a group capable of electron contact with a light emitting polymer, $R^3$ contains a conjugated group, and $R^2$ is a group capable of bonding to a conducting material.

22 Claims, 9 Drawing Sheets

LIGHT EMITTING POLYMER DEVICES USING SELF-ASSEMBLED MONOLAYER STRUCTURES

CROSS-REFERENCE TO RELATED APPLICATIONS

This application is Continuation of U.S. patent application Ser. No. 11/912,334, which was submitted for filing on Oct. 23, 2007, which is the U. S. National Stage of International Application No. PCT/US2006/015984, filed Apr. 27, 2006, which claims the priority benefit of U.S. provisional application 60/675,131, filed Apr. 27, 2005, all of which are hereby incorporated by reference to the extent not inconsistent with the disclosure herewith.

BACKGROUND OF THE INVENTION

Since the announcement of electroluminescent light emission from polymers by Burroughes et al (1) in 1990 the potential application of light emitting polymers (LEPs) in flat panel display devices (FPDs) has been investigated by numerous groups for both full color prototype display devices (2,3) and initial, monochrome commercial products. FPDs using LEPs have several potential advantages over the now well established liquid crystal display (LCD) technology. Among these advantages are: reduced form factor, reduced power consumption, increased brightness, reduced manufacturing costs, improved daylight readability, increased contrast and improved color purity (4). The construction of an FPD comprising LEP technology is very simple when compared to that used in the construction of an LCD-FPD, which can be readily illustrated by comparing FIGS. 1 and 2, which show exemplary materials used in the construction of a typical device.

Despite the projected economic advantages offered by the possible adoption of LEP technology, the development of devices using LEP technology has been hindered by a number of technical challenges. At present, engineering challenges associated with the scale up of laboratory prototype processes for large scale manufacturing limit the economic efficiency. It is anticipated that this difficulty will be overcome in time. A more serious issue is the persistent problem of device operating longevity. Device lifetime, which is limited by the slow degradation of both the interfaces between layers and chemical changes in the emissive material, is currently too short. In general, these effects vary for the different materials used to generate the primary colors, leading to an unacceptable variation in the ageing of the sub-pixels in a full color display (red lifetime≠green lifetime≠blue lifetime). The development of a long-lived and efficient blue emitting system, in particular, has remained a difficult problem for many years. Finally, an acute susceptibility to degradation by environmental moisture and oxygen requires the use of packaging techniques that constrain the choice of materials that can be used to fabricate the devices. Despite these significant frailties, LEP technology remains the subject of a great deal of research and development effort around the world, as this approach to organic light emitting device (OLED) technology offers the distinct possibility of 'wet processing', that is, ink jet printing or spin coating (5). These process technologies are well established and capable of delivering highly accurate and reproducible results at very low unit costs.

The most commercially successful of the various OLED technologies is the multilayer approach using small molecule fluorescent (SMF) technology that was originally reported in the seminal publication by Tang and van Slyke of the Kodak Corporation in 1987 (6), which is exemplified by the work of Kafafi et al (7). The organic compounds used in SMF devices exhibit the same environmental frailties seen in LEP materials, that is, they are very susceptible to degradation when exposed to either oxygen or moisture (8). The SMF approach to OLED utilizes a multi-layer or stacked approach of organic materials, with each layer fulfilling a particular role. The layers are: (1) an indium-tin oxide (ITO) anode; (2) a hole injection material; (3) a hole transport material; (4) an emitter; (5) an electron transport/hole blocking layer; and (6) a reflective metal cathode.

Other than the acute environment fragility observed in SMF based devices, this form of OLED technology is limited in its efficiency in converting electrical energy into light (electroluminescence efficiency), which is theoretically limited to 25% (9).

The potential quantum efficiency that can be attained using the small molecule approach has been enhanced by the development of triplet emitters or small molecule phosphorescent (SMP) technology that was developed initially by Forrest et al (10) and later commercialized by Universal Display Corporation (UDC). SMP emitters incorporate transition metal-atom-containing species that convert a high fraction of the input electric charge to emitted light and this form of technology possess a theoretical efficiency of 100%. Examples of SMP materials are adducts of the mercury trifunctional Lewis acid trimers and the arene compounds pyrene, naphthalene, and biphenyl (11). These adducts exhibit bright red, green, and blue phosphorescent emissions respectively in the solid state.

Despite the commercial success of SMF-OLED and the increasing success of SMP-OLED based devices, neither approach offers a satisfactory solution to the differing lifetimes observed in the various colors. SMF materials exhibit long lifetimes in the blue region of the spectrum and short lifetimes in the red region, while the opposite can be said for SMP materials, thus they cannot be viewed as being viable as a stand alone solution for high end FPDs, where lifetimes of at least 20,000 hours are a fundamental requirement. It is important to note, however, that in this common industry target "lifetime" is defined as the time until a 50% drop in the initial luminance of a device has occurred. Such a drop would produce an unacceptable differential ageing between neighboring pixels in displays in which persistent images or pull-down or pop-up text based screens are used. An additional limitation of both SMF and SMP-FPDs is that they are produced using organic vapor deposition (OVD) processes, which are expensive and arguably limited in the size of the substrate that can be used in the production process (12).

The multi-layer approach developed by both Kodak and UDC has undoubtedly paved the way for the expansion of OLED based technologies, which is expected to reach a market value of US $2.3 Billion by end of 2008, but if this vision is to be realized, further developments in OLED technologies must be made. The further expansion of OLEDs beyond niche applications such as intermittent use subdisplays in cellular telephones will not happen unless dramatic progress is made in the operating lifetime of the emissive pixels, especially blue.

LEP OLED technology offers potential economic advantages as well as a much higher efficiency when compared to SMF and much lower turn on voltages (13). When the electrons and holes injected from the opposing device electrodes meet in the bulk of the emissive layer, they combine to form a charge-neutral singlet or triplet excited state (exciton). The decay of that excited state results in the emission of light. During the charge-recombination process, the spin directions of the electrons involved can be oriented in one of four possible combinations, each with an equal statistical likelihood. The first pattern, the light-emitting 'singlet', can have only one of the four possible spin combinations. The other, a 'triplet', can have three different combinations. Thus, spin statistics predict that a singlet state will be formed in only 25% of all charge recombinations. Brédas (14) has shown theoretically that systems built from long polymer chains should be able to increase the percentage of light-emitting singlets to as high as 50%, which represents a 100% increase when compared to SMF. This increase in efficiency is believed to be a consequence of increasing molecular weight and as a result triplets take more time to convert to neutral excitons. This apparent increase in the decay time of the triplet state allows the unfavorable triplet state to 'convert' to a singlet, while singlet conversion to excitons remains rapid. As a result of this slowed decay, spin statistics are biased in favor of singlet formation and the resulting increase in efficiency. The primary limitation to the average molecular weight is solubility, that is, increasing molecular weight decreases solubility, which could potentially increase the difficulty of the subsequent processing of the polymeric materials. An alternative approach to improved efficiency in LEPs is being investigated by several groups, where they have reported improvement in the efficiency of an LEP by dispersing a phosphorescent 'dopant' material into an LEP 'host', with the result that it is possible to use all the excited states, both singlet and triplet, for light emission provided that the triplet energy gap of the host is higher than that of the guest (15).

As well as possessing a great deal of potential in 'traditional' display applications, LEPs possess the potential of being applied to flexible displays, which is an area of display development that is attracting a great deal of research effort (16).

It has been shown that the lifetime of an LEP-FPD is directly correlated to the applied voltage, that is, the higher the voltage the shorter the lifetime, thus in order to achieve the desired high brightness of modern applications, the lifetime of the device is by default, compromised (17). While significant strides have been made in the development of new polymeric materials, their lifetime is still not sufficiently acceptable for use in commercial products, particularly for the blue emitting materials. The blue emitting LEP materials tend to posses a wider band gap that tends to lead to a lower highest occupied molecular orbital (HOMO) level, which results in an energy-offset from the work function of the ITO electrode (18). Thus, successful development of blue-emitting LEP devices must include alternative approaches that address this offset in energy between the conducting material (for example ITO) and the blue-LEP material.

One such approach that has been investigated, particularly with respect to SMF technologies, is the use of self assembled monolayers (SAMs) in an effort to modify the field distribution in the vicinity of the anode to facilitate hole-injection (19-23). The use of SAMs has been reported to increase the internal efficiency of the emitting-layer; however, the previous approaches have not been adopted in the manufacture of OLED devices because the device performance was not improved sufficiently or the SAMs produced contained defects that result in inconsistent device performance, among other problems.

An improved LEP device is needed.

SUMMARY OF THE INVENTION

Provided is a light emitting device comprising: a transparent substrate; a layer of conducting material in contact with the transparent substrate; a self-assembled monolayer bonded to the layer of conducting material; a light emitting polymer layer in electron contact to the self-assembled monolayer; and a reflective metal layer in electron contact with the light emitting polymer layer. In operation, an electrical potential is applied across the conductive material and the reflective material. This results in electron-hole combination in the light emitting polymer layer, which results in the emission of light, as described herein. The self-assembled monolayer acts to lower the applied voltage required to generate light emission. The conducting material acts as the anode in the device and the reflective metal layer acts as the cathode in the device. The reflective metal can be any thickness of a suitable material, including Al, Mg, Ag, Au, In, Ca and mixtures and alloys thereof. The conductive material can be any suitable material, including indium tin oxide (ITO) and amalgams such as indium tin silver oxide. The conductive material is able to conduct electrons. The light emitting polymer layer is any material or combination of materials which is able to emit light with appropriate application of voltage. In one embodiment, the light emitting polymer layer comprises different light emitting polymers which each emit a different wavelength of light.

The self-assembled monolayer has the following structure:

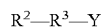

where Y is a group capable of electron contact with the light emitting polymer, $R^3$ contains a conjugated group, and $R^2$ is a group capable of bonding to the conducting material. In one embodiment, $R^2$ contains a silicon atom that is used to bond to the conducting material. In one embodiment, $R^2$ contains a phosphorous atom that is used to bond to the conducting material. In one embodiment, $R^2$ contains a sulfur atom that is used to bond to the conducting material. In one embodiment, $R^2$ contains the —P(O)(OH)$_2$ group. In one example, $R^2$ is a phenylsilane. In one embodiment, $R^2$ comprises:

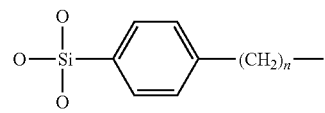

where n is an integer from 0 to 6 and one or more adjacent or nonadjacent CH$_2$ groups may be replaced with a heteroatom, for example, N, NH or O. One or more hydrogens in the CH$_2$ groups may be replaced with a halogen or —OH group. In the various structures shown, the group capable of bonding to the conducting material may be shown with one or more oxygen atoms. It is known in the art that one or more of the oxygen atoms may be from the surface of the conducting material. The groups shown herein, including the self-assembled monolayer groups, may contain one or more linker groups which are not specifically shown. These linker groups may be used for any desirable or useful purpose, including ease of synthesis, spacing, reactivity, performance, and other purposes, as known by one of ordinary skill in the art. Any suitable linker group known in the art may be used such as methylene groups (—CH$_2$—), oxygen atoms, ring structures, etc. In a particular SAM, the particular demarcations between the portions of the SAM ($R^2$, $R^3$ and Y) may be overlapping. As long as the structure contains a group or groups that fulfill the definitions provided for $R^2$, $R^3$ and Y, the structure is intended to be a SAM that is included in this invention.

In one embodiment, $R^3$ contains the following structure:

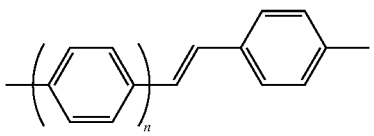

where n is an integer from 0 to 10. In one particular embodiment, n is 2.

Any of the rings shown in any structure or described herein or any other group shown or described herein may be independently substituted with one or more substitutents. These substituents may be any group that does not prevent the structure from performing its desired function, as described herein. Suitable substituents include: hydrogen; halogen; cyano; nitro; R; —OR; haloalkyl, alkenyl or haloalkenyl having from one to six carbon atoms; where R is an alkyl group having from one to 6 carbon atoms. Any of the alkyl groups may have one or more carbon atoms replaced with oxygen and may have one or more hydrogen atoms replaced with a halogen-containing group or a halogen. Exemplary Y groups include: hydrogen; halogen; cyano; nitro; R'; —OR'; —NR'$_2$; —SR'$_2$; where each R' is independently hydrogen or a straight chain or branched alkyl or alkenyl group with from one to 25 carbon atoms, where one or more carbon atoms may be optionally independently replaced with O or N, and which R' may include one or more optional halogen substituents. In one embodiment, Y is not $NO_2$. In one embodiment, Y is not $Cl_3$. In one embodiment, Y is not $NH_2$. In one embodiment, Y is not Cl. In all groups, substitution or replacement of listed groups with other groups is possible as long as the substitution or replacement does not prevent the group from performing its desired function, as described herein.

In one embodiment, the self-assembled monolayer is covalently bonded to the layer of conducting material. In one embodiment, the self-assembled monolayer is covalently bound to the layer of conducting material through Si—O bonds, P—O bonds, or S—O bonds. In one embodiment, the self-assembled monolayer does not contain any metal atoms or ions. In one embodiment, the light emitting polymer layer does not contain any metal atoms or ions. In one embodiment, there are not Si—O bonds between at least one of the self-assembled monolayer and light emitting polymer layer and the light emitting polymer layer and reflective metal layer. In one embodiment, the conducting material, self-assembled monolayer, light emitting polymer layer are all connected using covalent bonds or associative bonds or donor-acceptor bonds. In one embodiment, the conducting material and self-assembled monolayer are connected using covalent bonds or associative bonds or donor-acceptor bonds. In one embodiment, the self-assembled monolayer and light emitting polymer layer are connected using covalent bonds or associative bonds or donor-acceptor bonds. In one embodiment, the device does not contain a thiophene group. In one embodiment, the device or self-assembled monolayer does not contain cross-linked sections at the end opposite the group which bonds the conducting material. In one embodiment, there is only one SAM connected to the conductive material.

In one embodiment, there is not a covalent bond between the SAM and the light emitting polymer layer. In one embodiment, there is not a covalent bond between Y and the light emitting polymer layer. In one embodiment, the only silicon in the device other than any silicon which may be present in the substrate is bonded to the conducting material. In one embodiment, the SAM does not contain a N atom. In one embodiment, the SAM does not contain an aromatic amine bonded to a silicon atom. In one embodiment, R3 contains at least one additional conjugated group in addition to a benzene ring structure. In one embodiment, Y is not P-containing.

If an embodiment is specifically referred to, it is understood that the particular embodiment is merely intended to provide one specific example and not necessarily limit the entire invention or any other example, which may or may not be specifically exemplified.

The devices of the invention may be used in a pixel array, as known in the art.

Also provided are the self-assembled monolayers described herein, as well as the use of the self-assembled monolayers in devices as described herein. Also provided are methods of producing light comprising applying voltage to a device as described herein. Each component of the devices and structures shown or described herein can be combined with other components of the devices and structures shown and described herein, and all such combinations are intended to be included as if they were specifically illustrated or described. For example, a SAM from one device illustrated herein can be combined with a LEP from another device illustrated herein to form a new device.

As used herein, "layer" means that one or more monolayers of molecules or atoms are present, and is not meant to indicate that a perfect layer of molecules or atoms is formed. There may be gaps, cracks, pinholes or other defects present in a layer, as long as the gaps, cracks or other defects do not prevent the desired function. As used herein, "transparent" means some light can pass through the material.

As used herein, a "polymer" is a structure having a unit which repeats at least three times.

As used herein, "self-assembled monolayer" means a molecular layer of molecules is formed, where substantially all of the molecules in the self-assembled monolayer have substantially the same chemical and physical form. As known in the art, a "perfect" self-assembled monolayer is not possible using currently available synthesis and characterization techniques.

As used herein, "substantially" means that more of the given structures have the listed property than do not have the listed property. In one example, "substantially" means more than 50% of any given structures have the listed property. In one example, "substantially" means more than 60% of any given structures have the listed property. In one example, "substantially" means more than 70% of any given structures have the listed property. In one example, "substantially" means more than 80% of any given structures have the listed property. In one example, "substantially" means more than 90% of any given structures have the listed property. In one example, "substantially" means more than 95% of any given structures have the listed property. In one example, "substantially" means more than 97% of any given structures have the listed property. In one example, "substantially" means more than 99% of any given structures have the listed property.

As used herein, "electron contact" means that electrons can pass between one structure to another. As used herein, "contact" means two or more substances are in physical proximity with each other. "Contact" can mean bonded in one example.

As used herein, "bonded" means two or more chemical or physical elements are coupled or joined. "Bonded" can include chemical bonds, chemisorptive bonds, covalent bonds, ionic bonds, van der Waals bonds, and hydrogen bonds, for example. As used herein, "fluorescent" is intended to include phosphorescent, and vice versa. A "conjugated group" is a group having two C—C double bonds separated by a C—C single bond. One or more of the double bonds may be present in a ring structure. As used herein, "group" means one or more atoms. Group includes hydrogen.

BRIEF DESCRIPTION OF THE FIGURES

In FIG. 1, the reference numbers are used as follows: 1. Back light; 2. Polarizing film; 3. Active matrix substrate comprising indium tin oxide (ITO) pixel pads; 4. Polyimide or SiO$_2$ alignment layer; 5. Liquid crystal mixture; 6. Polyimide or SiO$_2$ alignment layer; 7. Color filters and black matrix; 8. Glass cover slide; 9. Analyzer film; 10. Brightness enhancement film; and 11. Integrated spacers.

In FIG. 2, the reference numbers are used as follows: 1. Active matrix substrate comprising ITO pixel pads (anode); 2. SiO$_2$ pixel separation pads; 3. Polyimide pixel separation ribs; 4. LEP materials, which include one or more polymers; 5. Lithium fluoride layer; and 6. Reflective metal electrode (cathode).

DETAILED DESCRIPTION OF THE INVENTION

Figure 1:
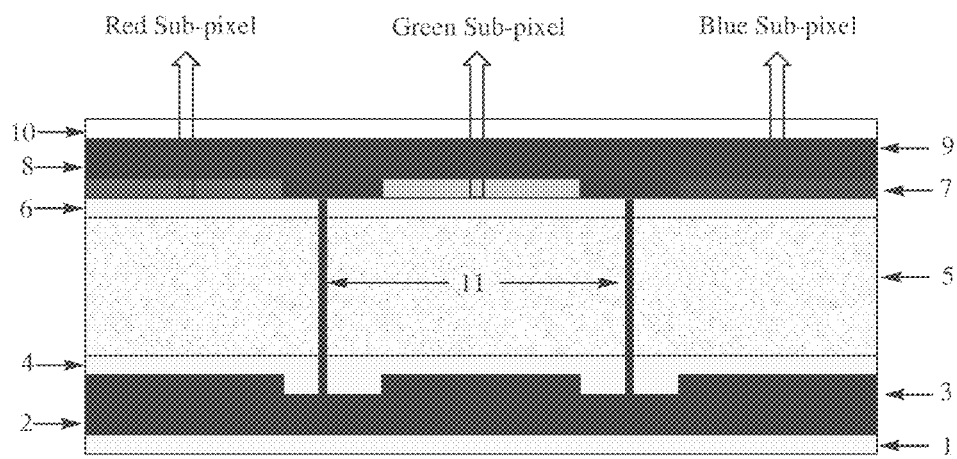
FIG. 1 shows an exemplary LCD-FPD.
Figure 2:
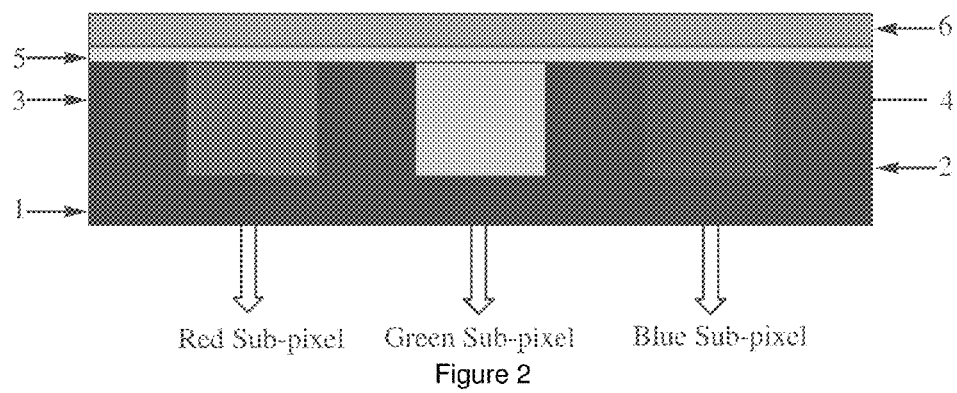
FIG. 2 shows an exemplary LEP-FPD.

The invention is further described using the following non-limiting examples. Applicant does not wish to be bound by any theory presented herein. The SAM deposition methodology described here results in the deposition of a substantially defect free surface using a precursor layer, which is illustrated in Scheme 1 below. In one embodiment, a substantially defect free surface contains at least 70% of the surface hydroxyl groups substituted with an atom such as silicon or phosphorous or sulfur that forms a covalent bond to the surface. In one embodiment, a substantially defect free surface contains at least 75% of the surface hydroxyl groups substituted with an atom such as silicon or phosphorous or sulfur that forms a covalent bond to the surface. In one embodiment, a substantially defect free surface contains at least 80% of the surface hydroxyl groups substituted with an atom such as silicon or phosphorous or sulfur which forms a covalent bond to the surface. In one embodiment, a substantially defect free surface contains at least 85% of the surface hydroxyl groups substituted with an atom such as silicon or phosphorous or sulfur which forms a covalent bond to the surface. In one embodiment, a substantially defect free surface contains at least 90% of the surface hydroxyl groups substituted with an atom such as silicon or phosphorous or sulfur which forms a covalent bond to the surface. In one embodiment, a substantially defect free surface contains at least 95% of the surface hydroxyl groups substituted with an atom such as silicon or phosphorous or sulfur which forms a covalent bond to the surface. In one embodiment, a substantially defect free surface contains at least 97% of the surface hydroxyl groups substituted with an atom such as silicon or phosphorous or sulfur which forms a covalent bond to the surface.

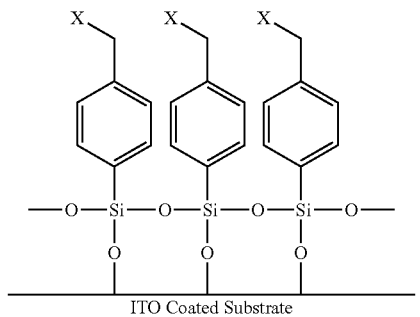

Scheme 1. Structure of the 'Precursor' SAM

In the example shown in Scheme 1, a trichlorosilane compound is used to form the precursor layer. The trichlorosilane compound is more reactive than previously described compounds such as trimethoxysilane, although tribromosilanes, triiodosilane, and mono-halo-dialkyl silanes can also be used to form the SAM. It should also be noted that the use of the shown trichlorosilane compound can result only in the deposition of a monolayer, as opposed to a polymeric or agglomerated layer, as it contains no nucleophilic character, which further negates the possibility of polymerization. The precursor layer is subsequently modified at group X, which contains a chloro-, bromo- or iodo-substituent, using the materials described herein, which materials possess a conjugated chemical structure that allows enhanced hole-injection than currently available materials. Two examples of chemical modification of a "precursor" SAM are shown in Scheme 2.

Scheme 2. Chemical Modification of the Precursor SAM

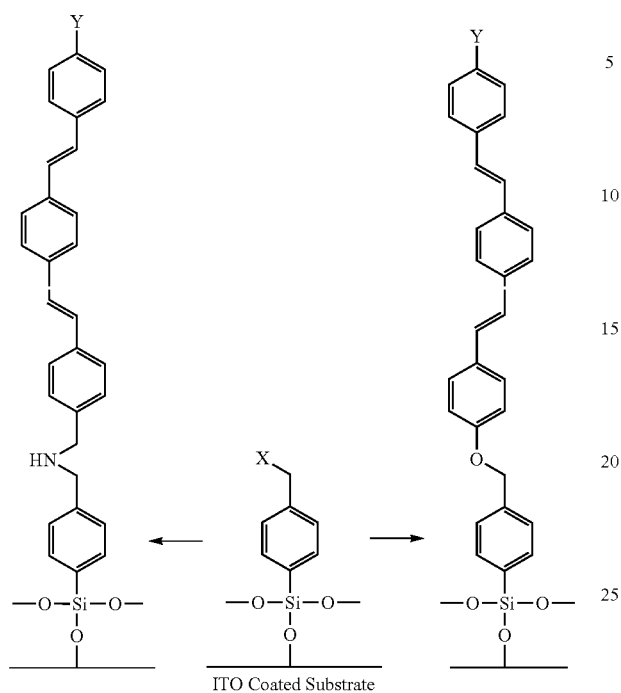

ITO Coated Substrate

Scheme 3. Some choices of SAMs.

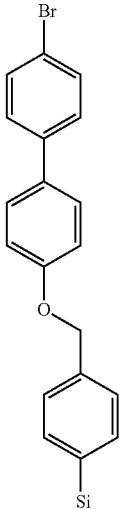

I

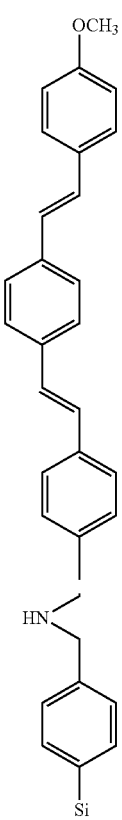

II

In the methods described herein, to form the SAM on the surface, the nucleophile is in the mobile phase (reactant) rather than the stationary phase (on the surface), as previously described. Furthermore, the compounds described herein and SAMs described herein are designed to be "long and thin", which promotes the development of a high quality film, as well as being able to mimic the functionality of those compounds currently used in the synthesis of LEP materials. "Thin" means when the compound or SAM is bound to the surface, either directly or through other groups, and the surface is considered the horizontal direction, the resulting modified surface has more surface area in the vertical direction than the horizontal direction than before the compound or SAM was bound to the surface. "Long" means the compound contains more than 10 atoms in the "thin" direction.

The chemical structure of group Y in Scheme 2 is such that the SAM electrically interacts favorably with the subsequently deposited LEP material which promotes the wetting of that polymer. Examples of the type of useful groups Y are illustrated in the structures shown in Scheme 3 and described elsewhere. These end groups and other useful end groups are known to one of ordinary skill in the art. In Scheme 3, the Si is not shown as attached to a surface, although it is understood that in one embodiment the Si is attached to a surface Si—O bond.

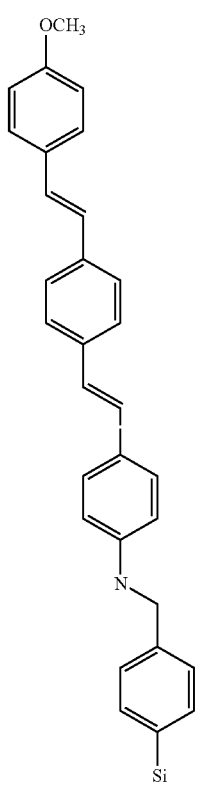
III
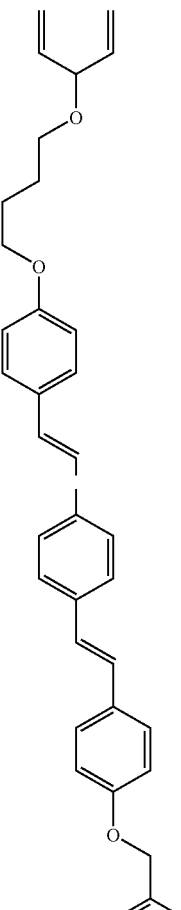
V
IV
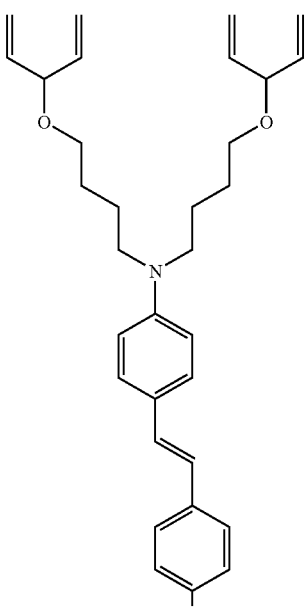
VI

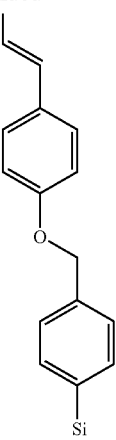

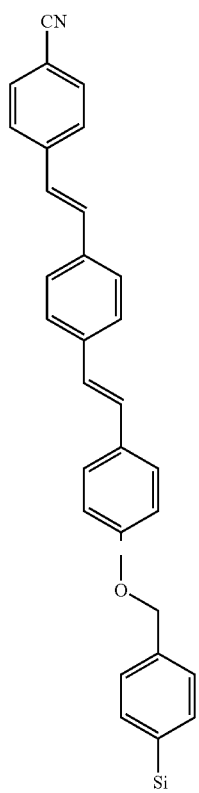

VII

The structure of the terminal groups in compounds V and VI are capable of being photo-polymerized, which is useful for desired purposes, for example: (1) the compounds can be crossed linked in order to provide a defect free surface prior to the deposition of the LEP material; and (2) by using an LEP material possessing the required chemical functionality as easily determined by one of ordinary skill in the art without undue experimentation and under the correct conditions, the LEP material can be cross-linked to the SAM, which has the effect of reducing the possibility of film delamination.

Figure 3:
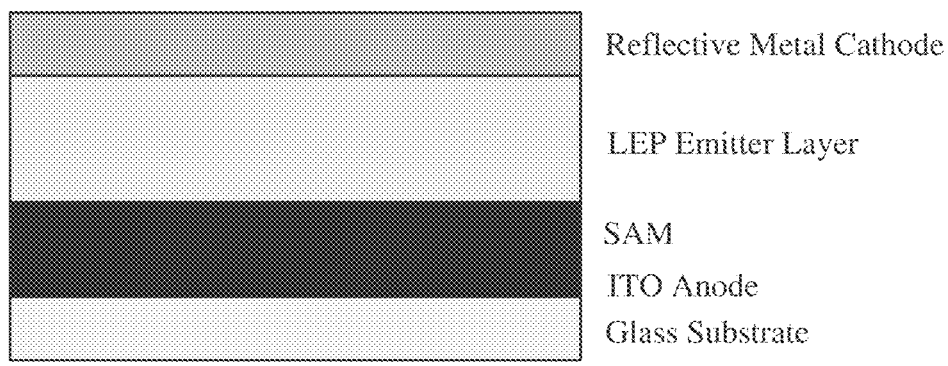
FIG. 3 shows the structure of a test device.

Once the SAM has been deposited and modified, the device construction is completed with the deposition of an LEP material. Two methods of depositing the LEP material are spin coating or ink-jet printing. The thickness of the LEP material used depends on the material used, as well as the desired amount of light emission, as known in the art. Some exemplary thicknesses are between 20 and 250 nm and 20 and 100 nm. After the LEP material is deposited, a reflective metal cathode comprising a reflective metal or metals, for example calcium, aluminum, silver or gold or combination thereof is deposited using any suitable method, for example vapor deposition. Any thickness of reflective metal layer may be used, as long as it functions in the desired method, as described herein. Some exemplary thicknesses are between 50 and 250 nm. The device may be encapsulated using a material such as any organic polymer that is impervious to both oxygen and moisture, a combination of polymers, a combination of polymers and vapor deposited inorganic materials, or glass possessing an edge seal comprising an adhesive that is impervious to both oxygen and moisture, however, for test purposes, the devices were not encapsulated, which is illustrated in FIG. 3. The device is connected to a voltage source, using methods known to one of ordinary skill in the art.

Once constructed, the electro-optic characteristics of the test devices are fully examined, which may include measurements such as the following: 1. Forward current vs. applied voltage to an approximate brightness of 250 cd/m$^2$; 2. Reverse current vs. applied voltage to an applied voltage equal in magnitude to that required to produce an approximate brightness of 250 cd m$^{-2}$ under forward bias; 3. Integrated light output vs. applied voltage to an approximate brightness of 250 cd m$^{-2}$; 4. Absolute light intensity is measured; and 5. The optical spectrum is recorded. One of ordinary skill in the art is able to carry out these characterization studies without undue experimentation.

LEP materials are well known in the art. Some LEP materials used in the construction of the devices are illustrated in, but limited to the polymers shown in Scheme 4. Other useful LEP materials are known in the art. Mixtures of polymers may be used, as known in the art. As known in the art, substituents may be added to the LEP materials to perform any useful function, including shifting the emission wavelength, for ease in synthesis, or other purposes, as known in the art. These substituents may be added using methods known in the art without undue experimentation. A useful molecular weight range is known in the art and easily determined without undue experimentation. The useful molecular weight range is determined by parameters such as solubility, as described herein.

Scheme 4. Examples of LEP materials that are commercially available.

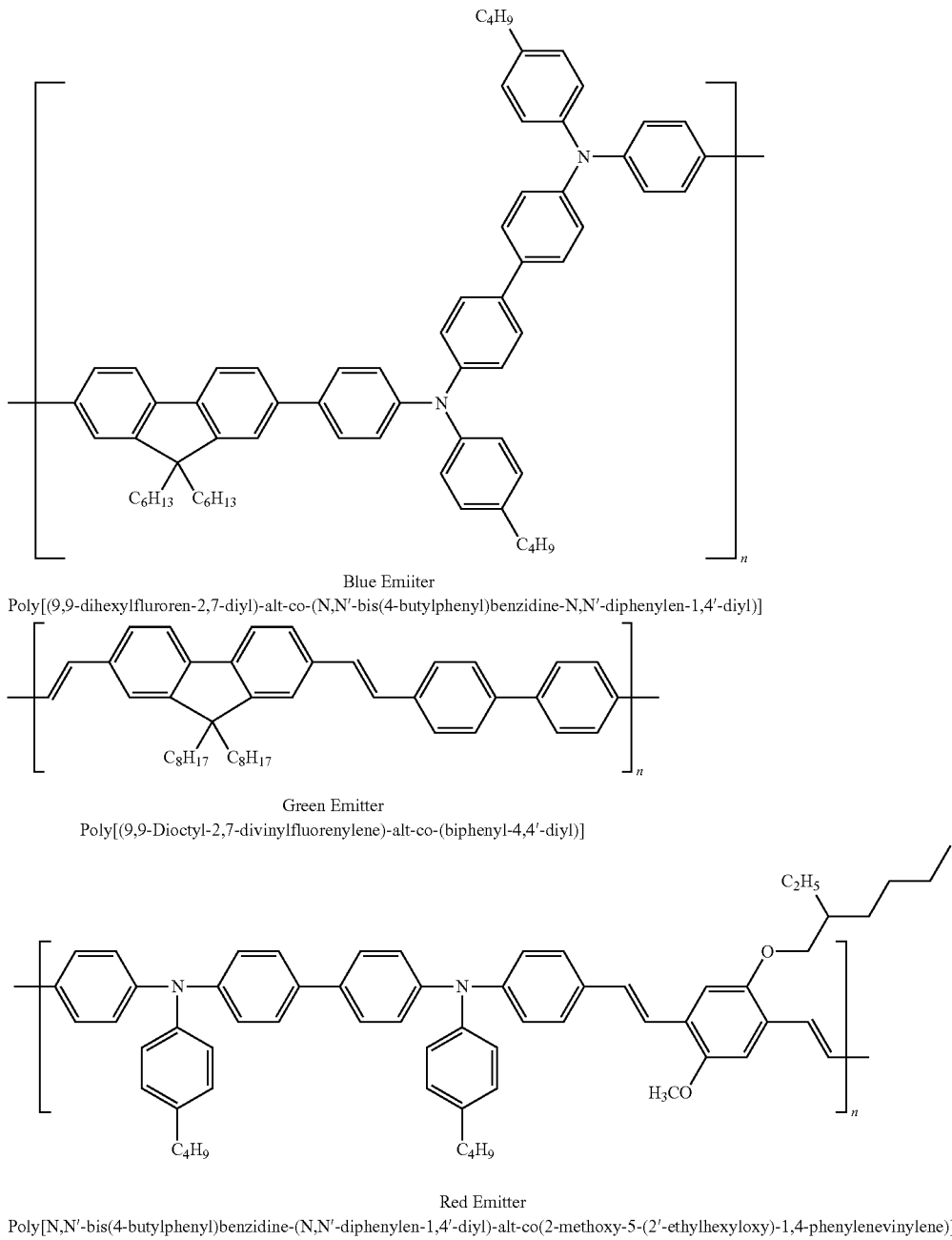

Blue Emitter
Poly[(9,9-dihexylfluroren-2,7-diyl)-alt-co-(N,N'-bis(4-butylphenyl)benzidine-N,N'-diphenylen-1,4'-diyl)]

Green Emitter
Poly[(9,9-Dioctyl-2,7-divinylfluorenylene)-alt-co-(biphenyl-4,4'-diyl)]

Red Emitter
Poly[N,N'-bis(4-butylphenyl)benzidine-(N,N'-diphenylen-1,4'-diyl)-alt-co(2-methoxy-5-(2'-ethylhexyloxy)-1,4-phenylenevinylene)]

As known in the art, the LEP may include a phosphorescent material in an amount useful to increase the light emission efficiency.

In some embodiments of the invention, the devices have electroluminescence efficiency values higher than a reference device. In some embodiments of the invention, the devices have electroluminescence efficiency values 25% higher than a reference device. In some embodiments of the invention, the devices have electroluminescence efficiency values 40% higher than a reference device. In some embodiments of the invention, the devices have electroluminescence efficiency values 43% higher than a reference device. In other embodiments of the invention, the devices possessed a higher current density in the 3 to 4 volt range, when compared to a reference device. Devices constructed using the methodologies presented herein, require the deposition of a single polymer only, which reduces the device to device variability by 50% when compared to a two-layer LEP device, which represents a significant improvement in the manufacturing process. Deposition of a single polymer layer on an already modified surface resulted in an improved film quality, possessing fewer nascent shorts and which will improve the expected lifetime of the display device.

General Synthetic Methods

The materials described can be synthesized using the procedures described herein and well established organic synthetic procedures known to one having ordinary skill in the art without undue experimentation, some of which are detailed in the following exemplary reaction schemes and other schemes that are known to one of ordinary skill in the art, which schemes can easily be modified by one of ordinary skill in the art to prepare all compounds described herein.

Scheme 5. Synthesis of compound II.

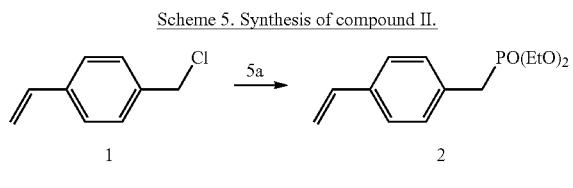

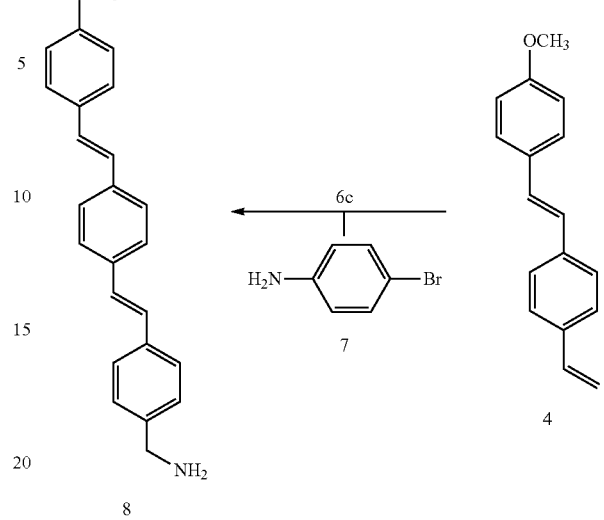

Reactions and reagents that could be used in the preparation of compound 8:
6a. P(OEt)$_3$, NaI, EtOH;
6b. LDA, THF, 0° C.;
6c. Pd(OAc)$_2$, Et$_3$N, PPh$_3$, Toluene, reflux.

Scheme 7. Synthesis of compound IV.

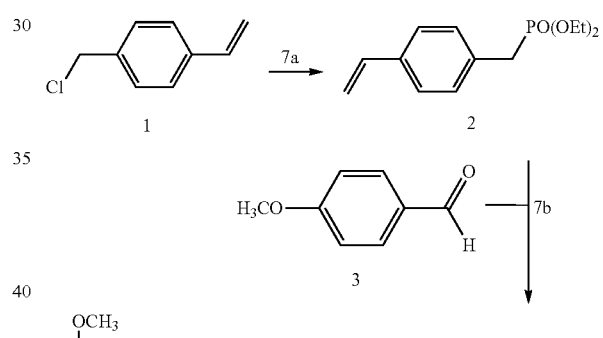

Reactions and reagents that could be used in the preparation of compound 6:
5a. P(OEt)$_3$, NaI, EtOH;
5b. LDA, THF, 0° C.;
5c. Pd(OAc)$_2$, Et$_3$N, PPh$_3$, Toluene, reflux;

Scheme 6. Synthesis of compound III.

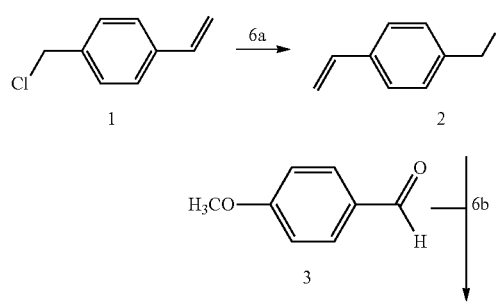

Reactions and reagents that could be used in the preparation of compound 11:
7a. P(OEt)$_3$, NaI, EtOH;
7b. LDA, THF, 0° C.;
7c. Chloromethoxymethane, THF, 0° C.;
7d. i) Pd(OAc)$_2$, Et$_3$N, PPh$_3$, Toluene, reflux, ii) H$^+$, THF.

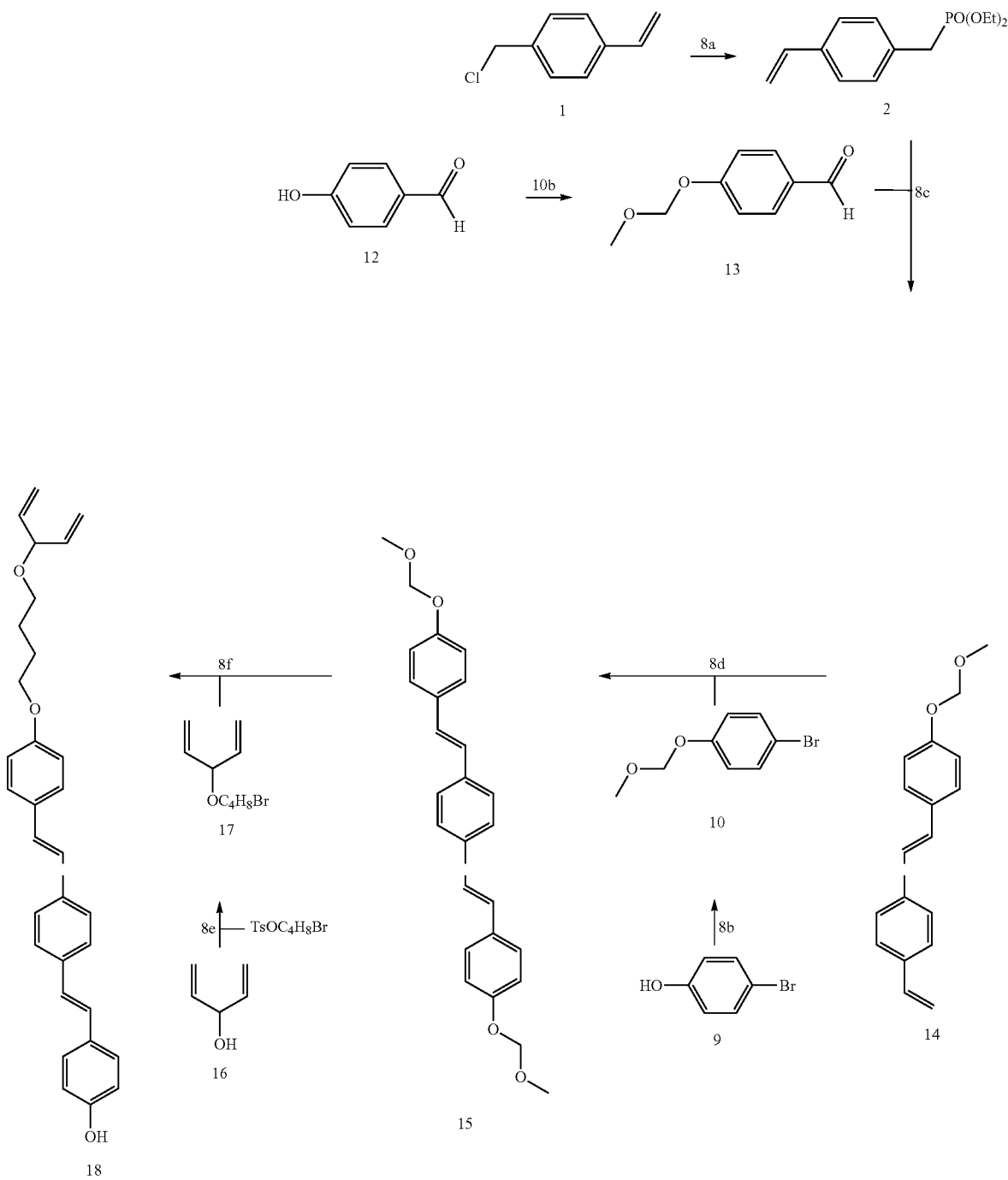
Scheme 8. Synthesis of compound V.
Reactions and reagents that could be used in the preparation of compound 18:
8a. P(OEt)$_3$, NaI, EtOH;
8b. Chloromethoxymethane, THF, 0° C.;
8c. LDA, THF, 0° C.;
8d. i) Pd(OAc)$_2$, Et$_3$N, PPh$_3$, Toluene, reflux; ii) H$^+$, THF;
8e. Toluene-4-sulfonic acid 4-bromobutyl ester, Cs$_2$CO$_3$, DMF, reflux;
8f. Na$_2$CO$_3$, DMF, reflux.

Scheme 9. Synthesis of compound VI.
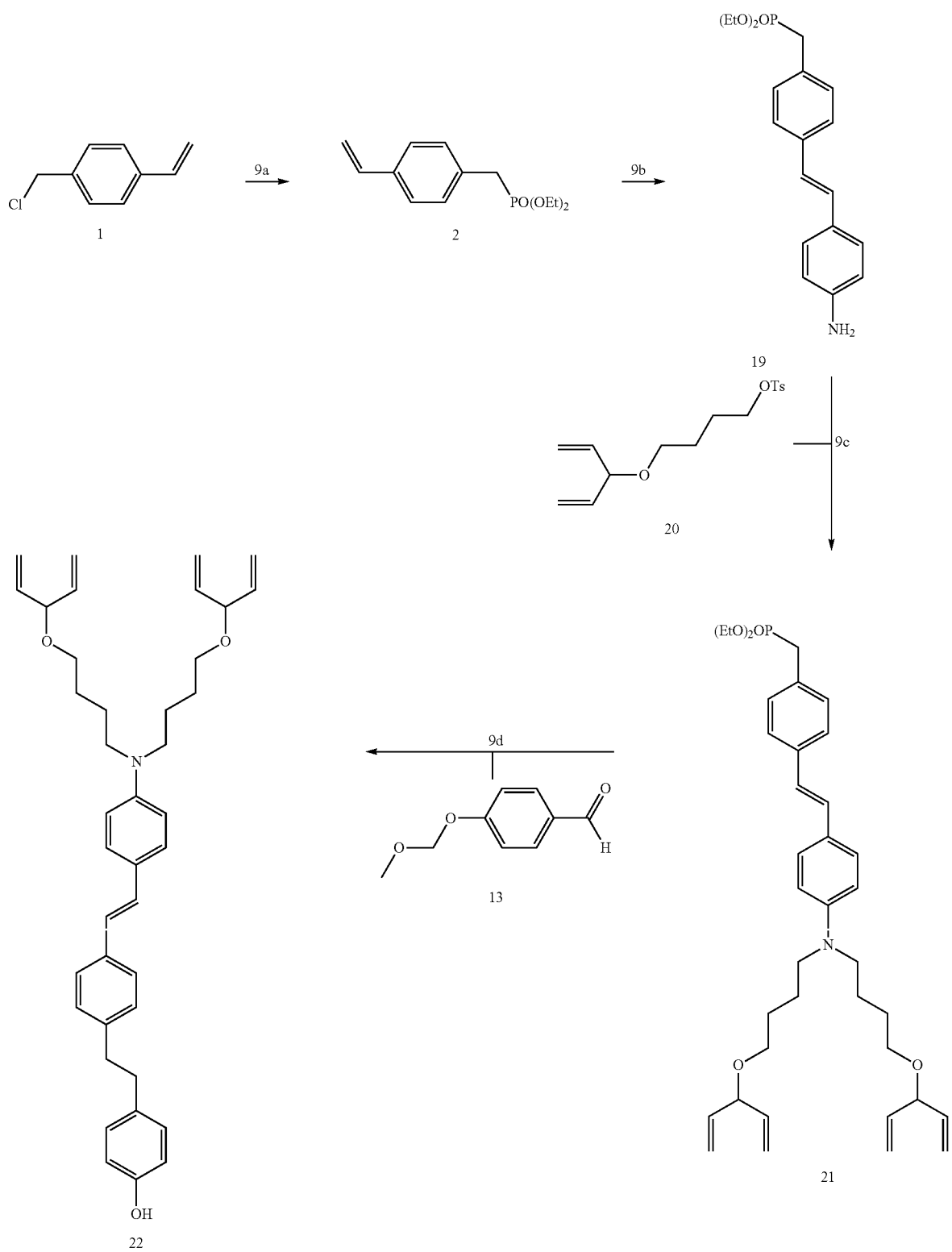
Reactions and reagents that could be used in the preparation of compound 22:
9a. P(OEt)$_3$, NaI, EtOH;
9b. Pd(OAc)$_2$, Et$_3$N, PPh$_3$, Toluene, reflux;
9c. Na$_2$CO$_3$, DMF, reflux;
9d. i) LDA, THF 0° C., ii) H$^+$, THF.

23

Scheme 10. Synthesis of compound VII.

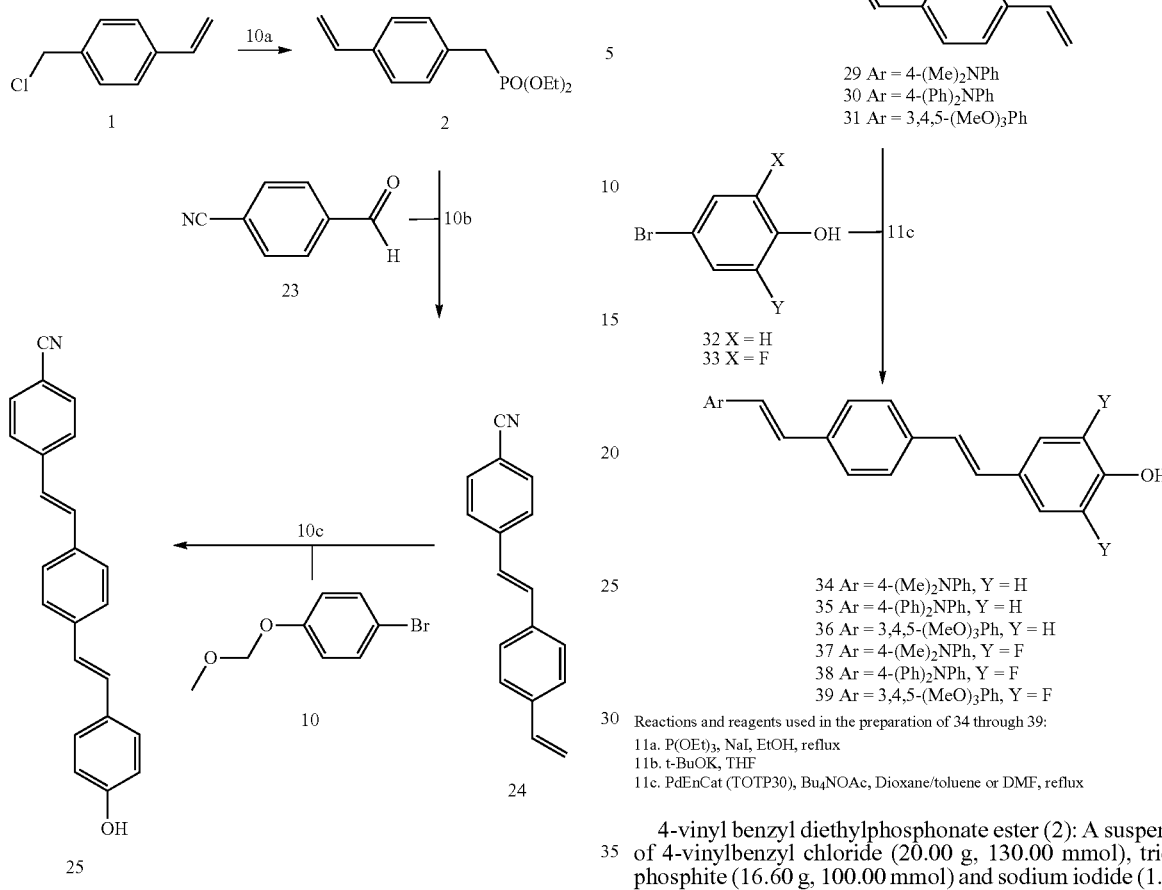

Reaction and reagents that could be used in the preparation of compound 25:
10a. P(OEt)$_3$, NaI, EtOH;
10b. LDA, THF, 0° C.;
10c. i) Pd(OAc)$_2$, Et$_3$N, PPh$_3$, Toluene, reflux ii) H$^+$, THF.

Scheme 11

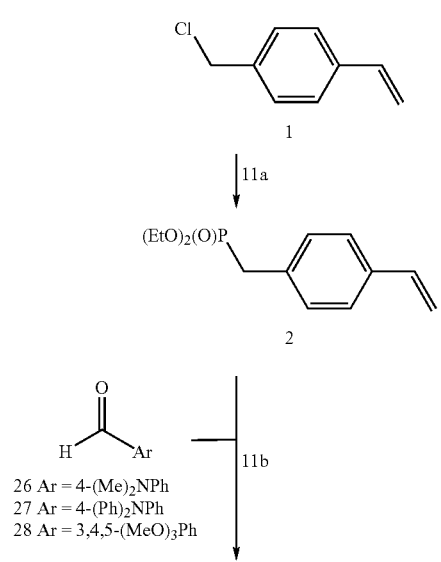

26 Ar = 4-(Me)$_2$NPh
27 Ar = 4-(Ph)$_2$NPh
28 Ar = 3,4,5-(MeO)$_3$Ph

24

-continued

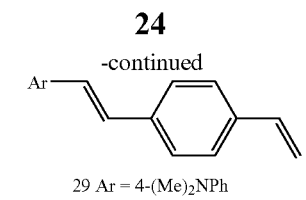

29 Ar = 4-(Me)$_2$NPh
30 Ar = 4-(Ph)$_2$NPh
31 Ar = 3,4,5-(MeO)$_3$Ph

32 X = H
33 X = F

34 Ar = 4-(Me)$_2$NPh, Y = H
35 Ar = 4-(Ph)$_2$NPh, Y = H
36 Ar = 3,4,5-(MeO)$_3$Ph, Y = H
37 Ar = 4-(Me)$_2$NPh, Y = F
38 Ar = 4-(Ph)$_2$NPh, Y = F
39 Ar = 3,4,5-(MeO)$_3$Ph, Y = F

Reactions and reagents used in the preparation of 34 through 39:
11a. P(OEt)$_3$, NaI, EtOH, reflux
11b. t-BuOK, THF
11c. PdEnCat (TOTP30), Bu$_4$NOAc, Dioxane/toluene or DMF, reflux 4-vinyl benzyl diethylphosphonate ester (2): A suspension of 4-vinylbenzyl chloride (20.00 g, 130.00 mmol), triethyl phosphite (16.60 g, 100.00 mmol) and sodium iodide (1.50 g, 10.00 mmol) in ethanol (EtOH) (150 ml) was heated under reflux under an atmosphere of dry nitrogen for 24 hrs. The reaction mixture was cooled to room temperature, concentrated in vacuo and the residues dissolved in ethyl acetate (EtOAc) (150 ml), washed with saturated sodium carbonate solution in water (100 ml) and the organic phase extracted in to EtOAc (100 ml×4). The combined extracts were dried (MgSO$_4$), filtered, the solvent removed in vacuo and the residues purified by column chromatography [silica gel eluted with a graduated eluent from 100% hexane to 100% ethyl acetate] providing a colorless oil (22.4 g, 88.0 mmol, yield 88%).

(4-methoxyphenyl)-ethylene-4-vinyl benzene (4): A solution of compound 2 (8.00 g, 31.50 mmol) and p-anisaldehyde (3.57 g, 26.20 mmol) in THF (70 ml) was added dropwise to a stirred, cooled (0° C.) solution of lithium diisopropyl amide (LDA), which was generated by stirring 30 min at 0° C. with diisopropyl amine (4.95 ml, 35.00 mmol) in THF (100 ml) and n-butyllithium (n-BuLi) (17.5 ml, 35.00 mmol, 2.0 mol dm$^{-3}$ in hexanes). The reaction mixture was warmed to room temperature and stirred for 16 h, the solvent removed in vacuo and the residues dissolved in water (100 ml) and the organic phase extracted in to dichloromethane (CH$_2$Cl$_2$, 100 ml×2). The combined organic extracts were dried (MgSO$_4$), filtered, evaporated and washed with hexane providing a white solid (6.7 g, yield 90%).

Preparation of Compound 29

Quantities: compound 2 (5.80 g, 23.10 mmol) and 4-dimethylaminobenzaldehyde (26) (3.45 g, 23.10 mmol), t-BuOK (5.18 g, 46.20 mmol) in THF (220 ml). The experimental procedure was as described for the preparation of compound 4 (3.83 g yield 66%); $^1$H NMR (CDCl$_3$) δ 2.99 (6H, s), 5.22 (1H, d), 5.74 (1H, d), 6.71 (1H, dd), 6.72 (2H, d), 6.91(1H,d), 7.06 (1H, d), 7.42 (6H, m).

Preparation of Compound 30

Quantities: compound 2 (14.37 g, 56.53 mmol), 4-diphenylamino-benzaldehyde (27) (15.03 g, 56.53 mmol) and t-BuOK (12.34 g, 110 mmol). The experimental procedure was as described for the preparation of compound 4 (15 g yield 71%).

Preparation of Compound 31

Quantities: compound 2 (7 g, 27.54 mmol) and 3,4,5-trimethoxy-benzaldehyde (28) (5.4 g, 27.54 mmol) and t-BuOK (6.18 g, 55.08 mmol). The experimental procedure was as described for the preparation of compound 3 (3.5 g yield 43%); $^1$H NMR (CDCl$_3$) δ 3.83 (3H, s), 3.93 (6H, s), 5.27 (1H, d), 5.78 (1H, d), 6.73 (1H, dd), 6.75 (2H, s), 7.03 (2H, dd), 7.42 (2H, d), 7.48 (2H, d) MS (ESI-) 297.1(M+H$^+$).

Preparation of Compound 34

A suspension of compound 29 (1.00 g, 4.00 mmol), 4-iodophenol (0.968 g, 4.40 mmol), PdEnCat (1.00 g, 0.40 mmol, TOTP30) and tetrabutylammonium acetate (2.65 g, 8.80 mmol) in dimethylformamide (DMF) (50 ml) was heated under reflux under an atmosphere of dry nitrogen for 48 h. The reaction mixture was poured on to water (300 ml) and the resulting precipitate collected by filtration. The solid obtained was dissolved in THF, dried (MgSO$_4$, the solvent removed in vacuo and the crude product purified by column chromatography [silica gel eluted with a graduated eluent from 50% hexane: CH$_2$Cl$_2$, to CH$_2$Cl$_2$ to CH$_2$Cl$_2$:THF, 9:1] providing a green solid that was re-crystallized to provide green crystals (1.05 g, 77%); MS (ESI-) 340.2(M-H$^-$).

Preparation of Compound 35

Quantities: compound 30 (0.467 g, 1.25 mmol), 4-iodophenol (0.358 g, 1.63 mmol), PdEnCat (0.16 g, 0.0625 mmol, TOTP30) and tetrabutylammonium acetate (0.83 g, 2.75 mmol). The experimental procedure was as described for the preparation of compound 34 (0.40 g, 57%).

Preparation of Compound 36

Quantities: compound 31 (1 g, 3.37 mmol), 4-iodophenol (0.817 g, 3.71 mmol), PdEnCat (0.423 g, 0.169 mmol, TOTP30) and tetrabutylammonium acetate (2.24 g, 7.42 mmol). The experimental procedure was as described for the preparation of compound 34 (0.71 g, 54%); MS (ESI-) 387.2 (M-H$^-$).

Preparation of Compound 37

Quantities: compound 29 (1 g, 4.00 mmol), 2,6-difloro-4-bromophenol (0.920 g, 4.40 mmol), PdEnCat (0.5 g, 0.20 mmol, TOTP30) and tetrabutylammonium acetate (2.65 g, 8.80 mmol) The experimental procedure was as described for the preparation of compound 34 (0.70 g, 46%); MS (ESI-) 376.1(M-H$^-$).

Preparation of Compound 38

Quantities: compound 30 (1.00 g, 2.68 mmol), 2,6-difloro-4-bromophenol (0.727 g, 3.48 mmol), PdEnCat (0.34 g, 0.134 mmol, TOTP30) and tetrabutylammonium acetate (2.02 g, 6.70 mmol). The experimental procedure was as described for the preparation of compound 34 (0.61 g, 45%); MS (ESI-) 500.1(M-H$^-$).

Preparation of Compound 39

Quantities: compound 31 (1.00 g, 3.37 mmol), 2,6-difloro-4-bromophenol (0.77 g, 3.71 mmol), PdEnCat (0.423 g, 0.169 mmol, TOTP30) and tetrabutylammonium acetate (2.24 g, 7.42 mmol). The experimental procedure was as described for the preparation of compound 34 (0.82 g, 57%); MS (ESI-) 423.1(M-H$^-$).

Scheme 12

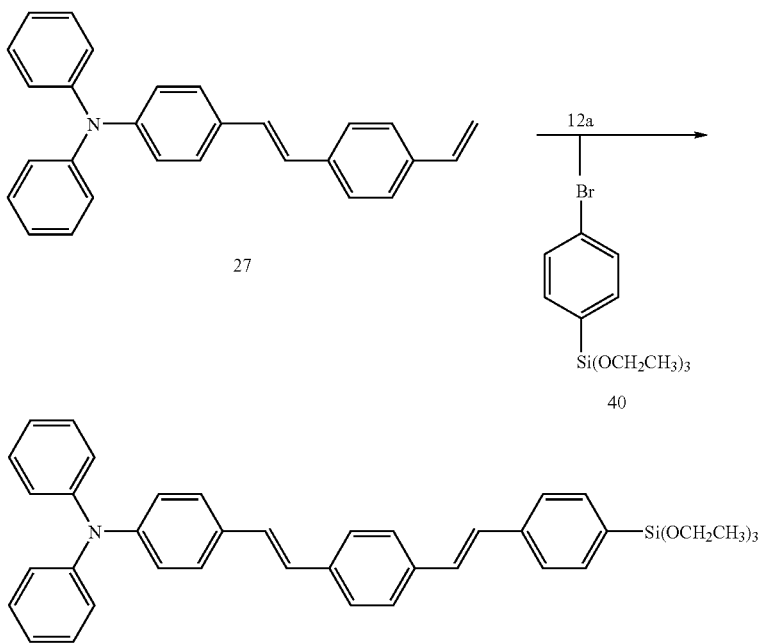

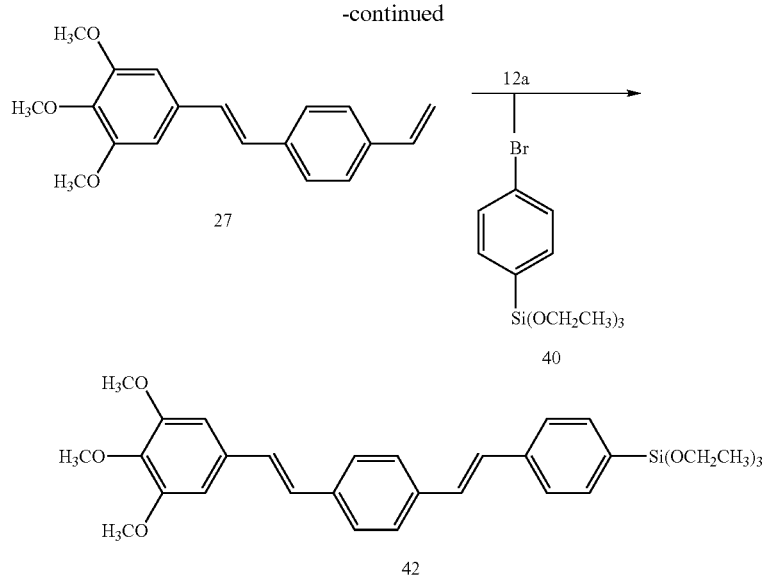

Reactions and reagents used in the preparation of compound 41 and 42:

12a. PdEnCat (TOTP30), Bu₄NOAc, Dioxane/toulene, reflux.

Preparation of Compound 40

Quantities: compound 30 (1.36 g, 3.64 mmol), (4-bromophenyl)triethoxysilane (2.33 g, 7.28 mmol), PdEnCat (0.46 g, 0.182 mmol, TOTP30) and tetrabutylammonium acetate (2.63 g, 8.74 mmol). The experimental procedure was as described for the preparation of compound 34 (0.60 g, 27%).

Preparation of Compound 41

Quantities: compound 31 (1.19 g, 4.00 mmol), (4-bromophenyl)triethoxysilane (1.92 g, 6.00 mmol), PdEnCat (0.50 g, 0.20 mmol, TOTP30) and tetrabutylammonium acetate (3 g, 10.00 mmol). The experimental procedure was as described for the preparation of compound 34 (0.8 g, 37%); $^1$H NMR (CDCl$_3$) δ 1.26 (9H, t), 3.88 (3H, s), 3.89 (6H, m), 3.93 (6H, s), 6.77 (2H, s), 7.05 (2H, dd), 7.15 (2H, dd), 7.53 (6H, m), 7.68 (2H, d).

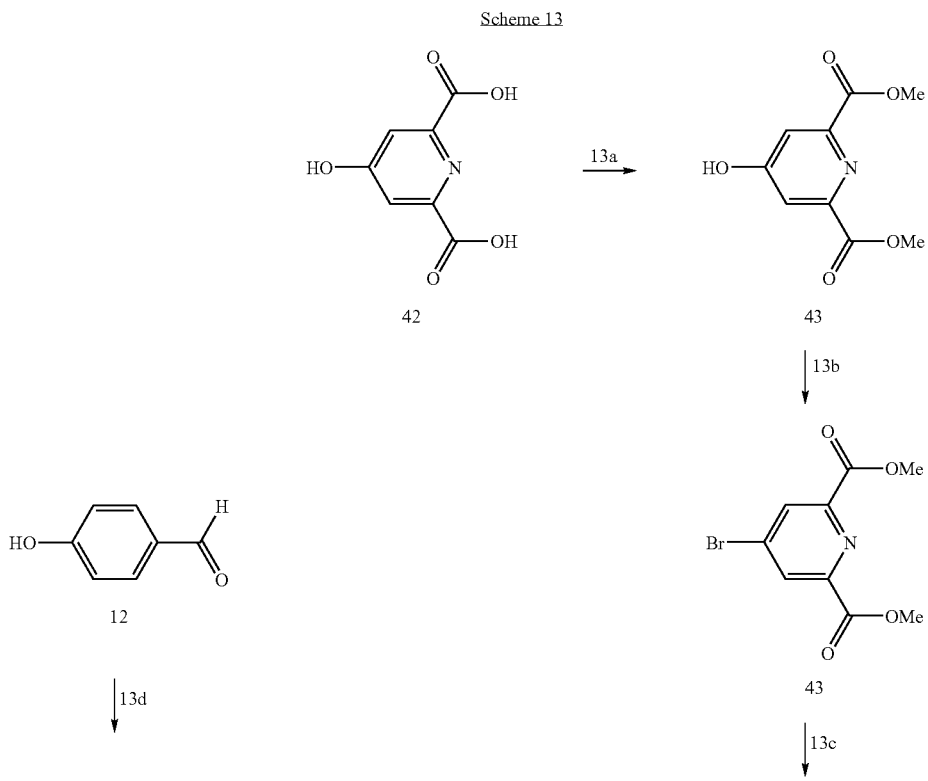

Scheme 13

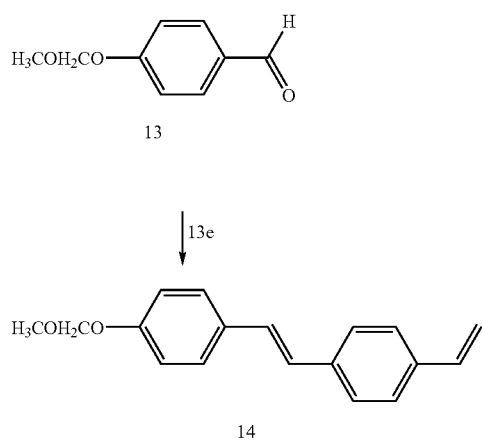

13

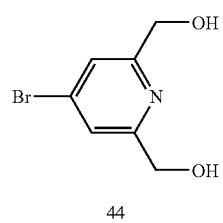

44

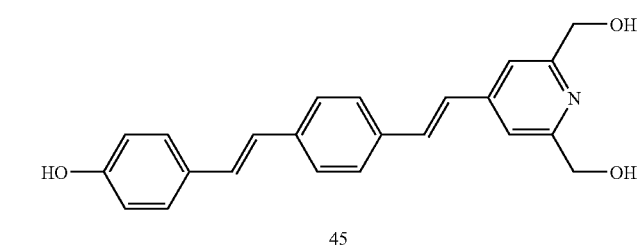

45

Reactions and reagents used in the preparation of compound 45:
13a. MeOH, HCl, reflux;
13b. PBr$_5$, CHCl$_3$;
13c. NaBH$_4$, EtOH;
13d. CH$_3$OCH$_2$Cl,
13e. t-BuOK, THF;
13f. PdEnCat, n-Bu$_4$NOAc, dioxane, toluene.

Preparation of 4-hydroxy-pyridine-2,6-dicarboxylic acid dimethyl ester (43)

Chelidamic acid (70 g, 0.38 mol) in a solution of hydrochloric acid (HCl) (6.0 ml) and methanol (MeOH) (1000 ml) was heated under reflux for 24 h, MgSO$_4$ (30 g) was added and reaction mixture heated under reflux for a further 24 h. After cooling to room temperature, the solution was filtrated, concentrated and dissolved in mixture of EtOAc (500 ml), sodium hydrogen carbonate solution (NaHCO$_3$) (200 ml) and water (150 ml). The organic phase was extracted in to EtOAc (3×200 ml), the combined extracts dried (MgSO$_4$) and the solvent removed in vacuo providing a white solid (70.0 g, 331 mmol, 87%).

Preparation of Compound 44

A solution of compound 43 (44.6 g, 0.21 mol) and phosphorus pentabromide (100.0 g, 0.23 mol) in chloroform (800 ml) was heated under reflux for 34 hours. After cooling to room temperature, MeOH was added (85 ml) and reaction mixture stirred for 10 hours, water (100 ml) was added and the resulting solution neutralized by the addition of sodium hydroxide solution (NaOH) (70 ml, 5N) and NaHCO$_3$. The organic phase was extracted in to EtOAc (3×200 ml), the combined extracts dried (MgSO4), the solvent removed in vacuo and the crude product recrystallized from MeOH (44.0 g, 0.16 mol, 76%).

Preparation of Compound 44

Sodium borohydride (12.5 g, 0.33 mol) was added to a solution of compound 43 (20.07 g, 0.073 mol) in EtOH (250 ml) at 0° C. and the reaction stirred for 40 h at room temperature followed by heating under reflux for 10 min. The reaction mixture was concentrated, water (50 ml) added and the organic phase extracted in to DCM (3×200 ml), the combined extract dried (MgSO4) and the solvent removed in vacuo (15.0 g, 66.6 mmol, 91%).

Preparation of Compound 13

Methoxymethyl chloride (22.00 ml, 0.285 mol) was added dropwise to a suspension of 4-hydroxybenzaldehyde (24.42 g, 0.200 mol) and potassium carbonate (55.28 g, 0.400 mol) in DMF (200 ml) at 0° C. After warming to room temperature, the reaction mixture was stirred for 20 h. Diethyl ether (200 ml) and NaOH solution (200 ml, 1 M) were added and the organic phase extracted in to DCM (3×200 ml). The combined extracts were dried (MgSO$_4$), the solvent removed in vacuo and the residue purified by column chromatography [silica gel eluted with a graduated eluent from hexane:EtOAc, 9:1 to hexane:EtOAc 8:1] providing a colorless oil product (11.00 g, yield 33%).

Preparation of Compound 14

Quantities: compound 2 (5.48 g, 21.56 mmol), compound 13 (3.58 g, 21.56 mmol) and t-BuOK (6 g, 53.9 mmol). The experimental procedure was as described for the preparation of compound 4 (4.7 g, 82%).

Preparation of Compound 45

Quantities compound 44 (1.36 g, 5.11 mmol), compound 14 (1.11 g, 5.11 mmol), PdEnCat (0.62 g, 0.25 mmol, TOTP30), tetrabutylammonium acetate (3.85 g, 12/8 mmol), dioxane and toluene (140 ml, 1:1) The experimental procedure was as described for the preparation of compound 34 (1.03 g, 56%); MS (ESI−) 358.2 (M−H$^+$).

Scheme 14

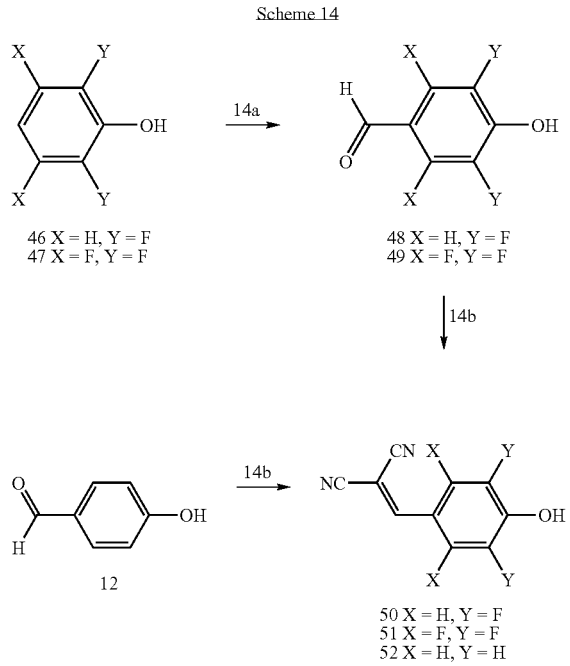

Reactions and reagents used in the preparation of compounds 50 through 52:
14a. HMTA, (CF$_3$CO$_2$H, reflux;
14b. Malononitrile, MeOH, reflux.

Preparation of 3,5-Difluoro-4-hydroxybenzaldehyde (48)

A solution of 2,6-difluorophenol (5.00 g, 38.43 mmol) and hexamethylenetetramine (HMTA) (5.93 g, 42.30 mmol) in trifluoroacetic acid (TFA) (50 ml) was heated under reflux 16 h. The reaction mixture was cooled to room temperature, poured on to HCl (150 ml 4 M) and stirred for 3 hours and brought to pH 3 via the addition of NaOH solution (5 M). The organic phase was extracted in to diethyl ether (4×100 ml), the combined ethereal extracts dried (MgSO$_4$) and the solvent removed in vacuo. The residue were purified by column chromatography [silica gel, eluted with hexane:EtOAc, 4:1] providing white solid (6.1 g, 38 mmol, 99%).

Preparation of 2,34,5-Tetrafluoro-4-hydroxybenzaldehyde (49)

Quantities: 2,3,5,6-Tetrafluorophenol (2.6 g, 15.61 mmol), HMTA (2.41 g, 17.22 mmol) and TFA (50 ml). The experimental procedure was as described for the preparation of compound 48 (1.5 g, 50%); MS (ESI−) 193.0 (M−H$^+$).

Preparation of Compound 50

A solution of compound 48 and (1.58 g, 10.00 mmol), malononitrile (0.99 g, 15.00 mmol) and piperidine (1 drop) in MeOH (50 ml) was refluxed for 20 hours, cooled to room temperature and the solvent removed in vacuo. The crude was purified by column chromatography [silica gel eluted with a graduated eluent from hexane to hexane: EtOAc, 3:1] and the crude product recrystallized from hexane and DCM (1.25 g, 61%); $^1$H NMR (CDCl$_3$) δ 3.60 (1H, s), 7.56 (1H, d), 7.59 (2H, s) MS (ESI−) 205.0 (M−H$^+$).

Preparation of Compound 51

Quantities: compound 31 (1.15 g, 5.93 mmol), malononitrile (0.59 g, 8.90 mmol), piperidine (1 drop) and MeOH (50 ml). The experimental procedure was as described for the preparation of compound 50 (0.25 g, 17%).

Preparation of Compound 52

Quantities: 4-hydroxy-benzaldehyde (12.20 g, 100.0 mmol), malononitrile (9.90 g, 150.0 mmol) and piperidine (10 drops) and MeOH (250 ml). The experimental procedure was as described for the preparation of compound 50 (127 g, 75%).

Scheme 15

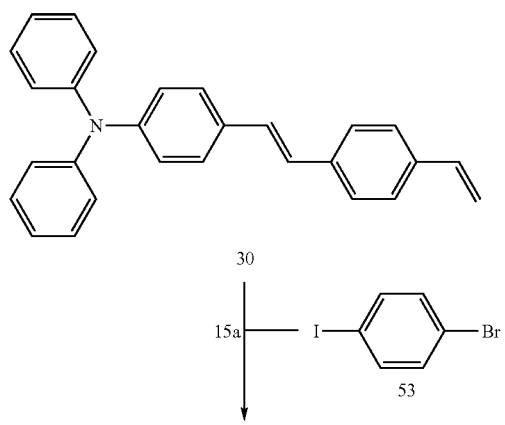

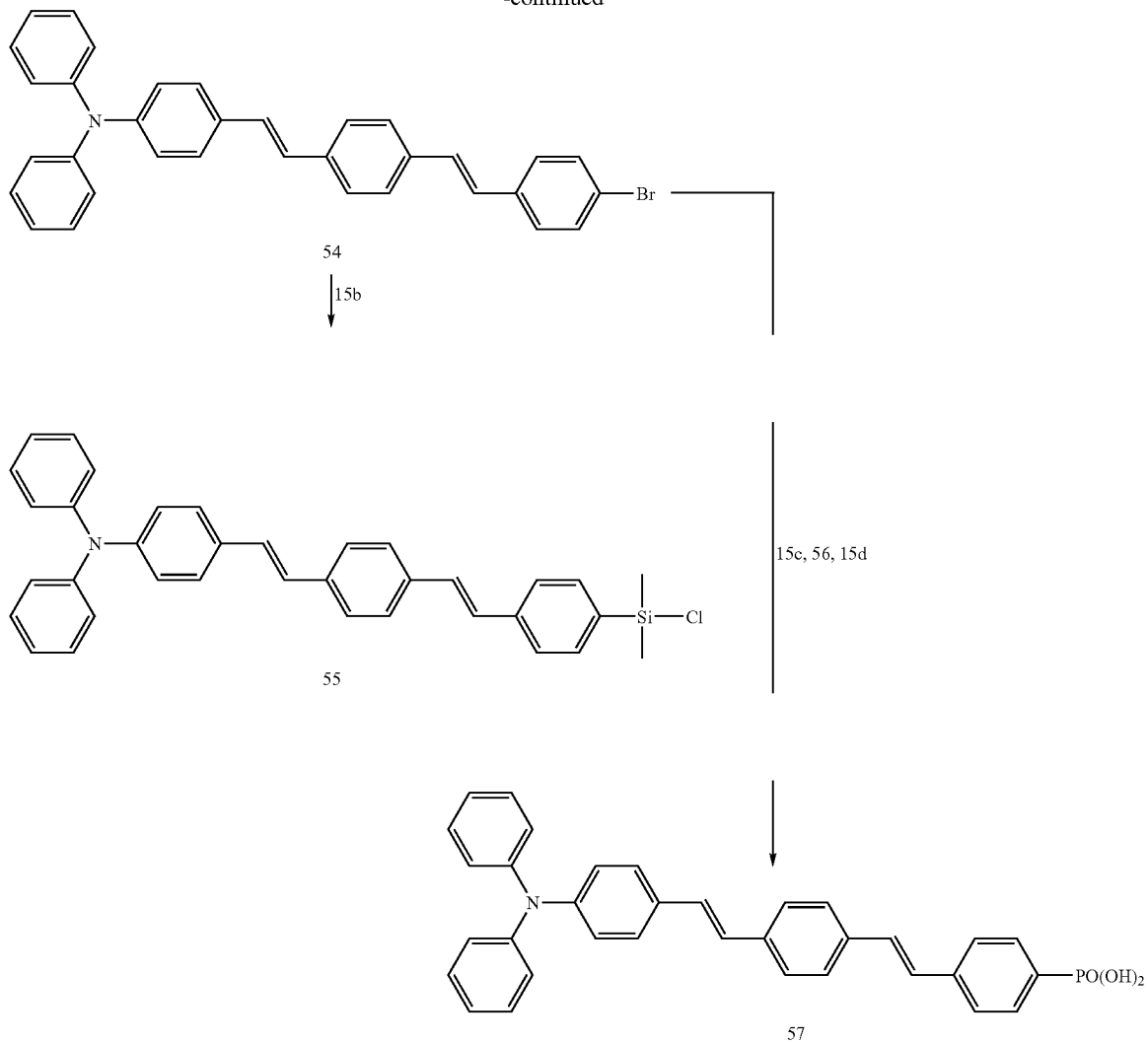

Reactions and reagents used in the preparation compounds 55 and 57:
15a. PdEnCat (TOTP30), Bu₄NOAc, THF, reflux;
15b. i) n-BuLi, THF, -78° C., ii) Me₂SiCl₂;
15c. Pd(PPh₃)₄, Et₃N, HOP(OEt)₂, Dioxane/Toluene; and
15d. i) TMSBr, CH₂Cl₂ ii) H₂O, Acetone.

Preparation of Compound 54

Quantities: compound 30 (2.00 g, 5.36 mmol), 4-bromoiodobenzene (1.52 g, 5.36 mmol), PdEnCat (0.68 g, 0.268 mmol, TOTP30) and tetrabutylammonium acetate (4.04 g, 13.4). The experimental procedure was as described for the preparation of compound 34 (2.00 g, 71%).

Preparation of Compound 55

A solution of n-butyl lithium (0.23 ml, 0.568, 2.5 mol dm⁻³ in hexanes) was added dropwise to a stirred, cooled (−78° C.) solution of compound 54 (0.30 g, 0.568) in THF (100 ml) under an atmosphere of dry nitrogen and the reaction mixture stirred at −78° C. for 2 hours, transferred to a solution of dichlorodimethylsilane in THF (50 ml) under an atmosphere of dry nitrogen and the reaction mixture stirred for 20 h. The solvent was removed in vacuo and the product used with no further purification.

Preparation of Compound 56

A suspension of compound 54 (1.60 g, 3.03 mmol), diethylphosphite (0.42 g, 3.03 mmol), tetrakis-triphenylphosphine palladium$^{(0)}$ (0.35 g, 0.30 mmol) and triethyl amine (0.77 g, 7.6 mmol) in dioxane and toluene (160 ml, 1:1) was heated under reflux for 50 h under an atmosphere of dry nitrogen. The reaction mixture was cooled to room temperature, THF (100 ml) added, the precipitate collected by filtration and the residues purified by column chromatography [silica gel, eluted with a graduated eluent from 50% hexane:EtOAc to EtOAc] providing a green solid that was recrystallized to provide green crystals (1.25 g, 70%); ¹H NMR (CDCl₃) δ 1.34 (6H, t), 4.13 (4H, m), 6.98-7.83 (26H, m) MS (ESI−) 286.3 (M+H⁺).

Preparation of Compound 57

A solution of compound 56 (1.25 g, 2.13 mmol) trimethylsilylbromide (1.10 ml, 8.54 mmol) in dry DCM (30 ml) was stirred at room temperature under an atmosphere of dry nitrogen for 20 h at ambient temperature. The solvent was removed in vacuo and the residues dissolved in acetone (30 ml), water was added (0.5 ml) and the reaction mixture stirred at room temperature for 2 h and the solvent removed in vacuo and the crude product recrystallized from THF and hexane (1.04 g, 92%); $^1$H NMR (CDCl$_3$) δ 7.48 (11H, m), 7.56 (5H, m), 7.68 (10H, m) MS (ESI−) 529.4 (M−H$^+$).

Device Preparation

Exemplary devices are prepared using the procedures described below:

Indium Tin Oxide Coated Glass Substrate Preparation 25 mm×25 mm indium tin oxide (ITO) coated borosilicate glass coupons were rinsed with ethanol, acetone and deionized (DI) water (18 K ohm) and dried under a stream of dry nitrogen. Each coupon was placed in a cleaned, dry glass vial that had been rinsed with acetone and toluene, a solution of 30% hydrogen peroxide, concentrated ammonium hydroxide, and DI water (2:1:5) added to the vial in an amount sufficient to completely cover the glass coupon and the vial submersed in an ultrasonic bath for 10 minutes. The vial was then placed into a hot water (60° C.) bath for 20 minutes and further treated with the ultrasonic bath for an additional 20 minutes, the glass coupon removed from the cleaning solution, washed with copious quantities of DI water and placed into a clean vial and dried under reduced pressure at 140° C. for 24 h. Although ITO coated glass was used in this example, it is known that other substrates, such as quartz, silicon wafers and polymeric substrates may be used, as well as other conducting materials such as zinc oxide, silver, gold and aluminum may be used.

Deposition of 4-Chloromethylphenyl trichlorosilane

A vial containing a cleaned and prepared ITO glass substrate was removed from the vacuum oven at room temperature and immediately stoppered. Anhydrous toluene (20 ml) was added and 4-chloromethylphenyl trichlorosilane (0.5 ml) added. The vial was placed in an ultrasonic bath for 5 minutes and then allowed to stand undisturbed for 24 hours at room temperature. The stopper was removed and the coupon transferred to a clean vial containing toluene. The samples were removed from the toluene and thoroughly rinsed with toluene, placed into another clean vial and allowed to dry for 24 h under reduced pressure at 40° C. XPS analysis found: Si 1 s 8.0% (theoretical 8.3%), Cl 1 s 8.2% (theoretical 8.3%). This step is illustrated in Scheme 16.

Secondary Deposition

An ITO coated glass coupon comprising the 4-chloromethylphenyl siloxane self assembled monolayer (SAM) was removed from the vacuum oven at room temperature and immediately immersed in a suspension of compound 38 (60.0 mg), lithium carbonate (10.0 mg) and potassium iodide (10.0 mg) in acetonitrile (20 ml) in a stainless steel pressure reactor and sealed. The reactor was heated at 100° C. for 48 h, cooled to 50° C., and the seal removed. The coupon was removed from the reactor and immersed in clean acetonitrile under ultrasonication for 10 min, rinsed with acetone, ethanol and toluene and dried under a stream of dry nitrogen. The coupon was placed in a clean vial and dried under reduced pressure at 40° C. for 12 h. XPS analysis found: N 1 s 2.0% (theoretical 2.1%), Si 1 s 1.8% (theoretical 2.1%). Two other examples of this step are shown in Scheme 17, where R is any useful group as described herein.

The 4-Chloromethylphenylsiloxane Self Assembled Monolayer was modified using the following exemplary procedure. ITO coated glass substrates comprising the (p-chloromethyl)phenyl-trichlorosiloxane self assembled monolayer were immersed in a solution of 4'-Bromo-[1,1'-biphenyl]-4-ol (0.10 g, 0.40 mmol), sodium carbonate (Na$_2$CO$_3$) (0.43 g, 4.0 mmol), sodium iodide (0.30 g, 2.0 mmol) in acetonitrile (CH$_3$CN) (40 ml) under an atmosphere of dry nitrogen. The sealed vials were heated at 60° C. for 100 h, cooled to room temperature, rinsed with CH$_3$CN, immersed in CH$_3$CN and ultra-sonicated for 5 min, rinsed with CH$_3$CN and dried under UHP argon. Finally, the slides were dried in a vacuum oven at 60° C. for 16 h. XPS analysis revealed Br 6.6% (theoretical 9.1%) Cl 3.2% (theoretical 0%) and Si 1 s 7.2% (theoretical 9.1%).

4'-Bromo-biphenyl-4-ol was chosen for testing purposes as the 4'-bromo substituent provides a strong signal during XPS analysis. As known in the art, other substituents may be used for the various parts of the self-assembled monolayer described herein.

Scheme 16

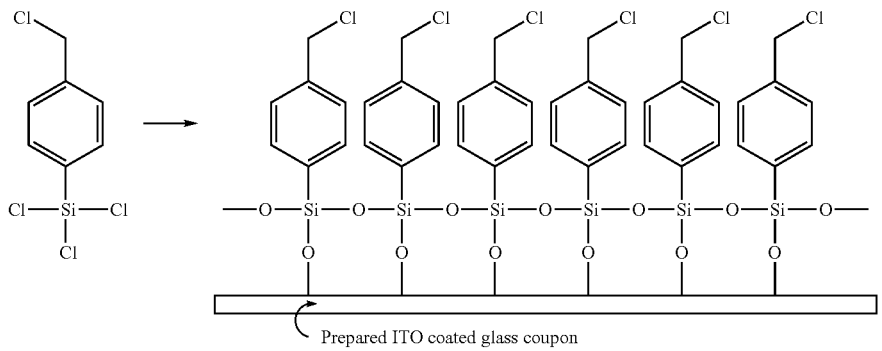

Scheme 17
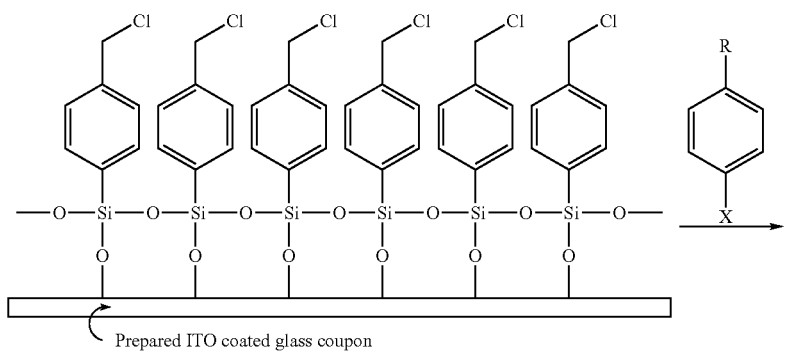
Prepared ITO coated glass coupon
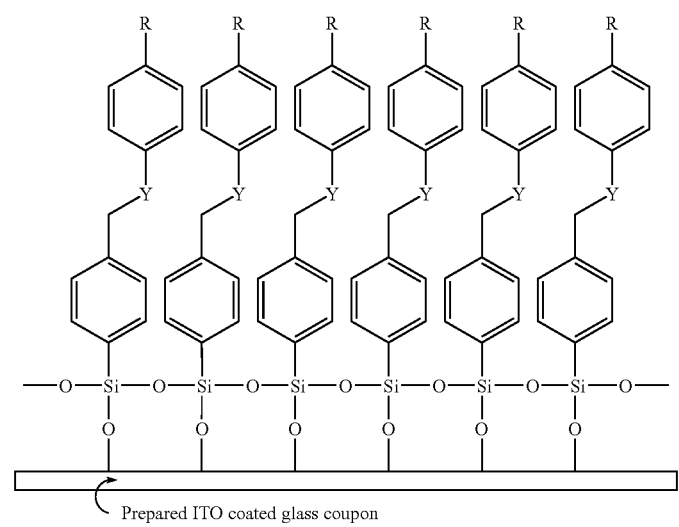
Prepared ITO coated glass coupon
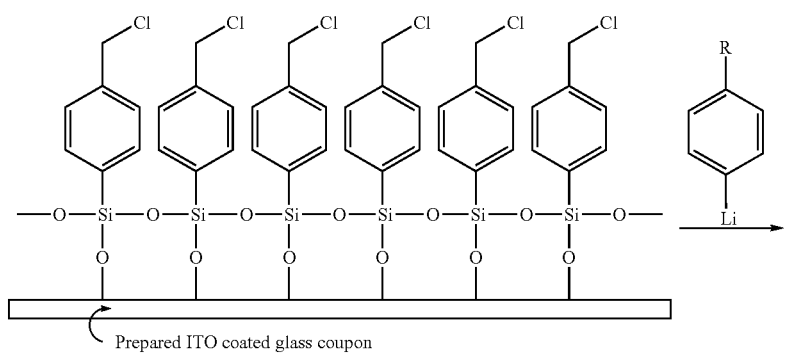
Prepared ITO coated glass coupon

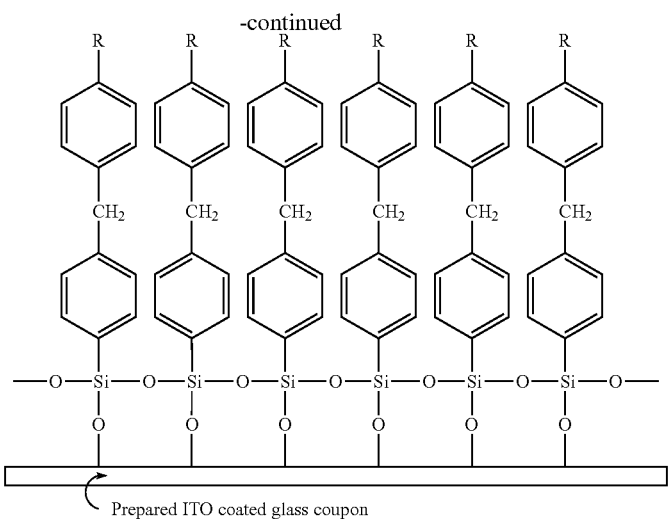
X = OH, NH$_2$, CH$_2$MgBr, Ph$^+$Li$^-$
Y = O, NH or CH$_2$
Scheme 18 illustrates another example of SAM synthesis, starting from the same deposition of 4-chloromethylphenyl trichlorosilane as Scheme 16. In Scheme 18, compound 27 is used as the conjugated group and contains the group capable of electron contact with the light emitting polymer.
Scheme 18
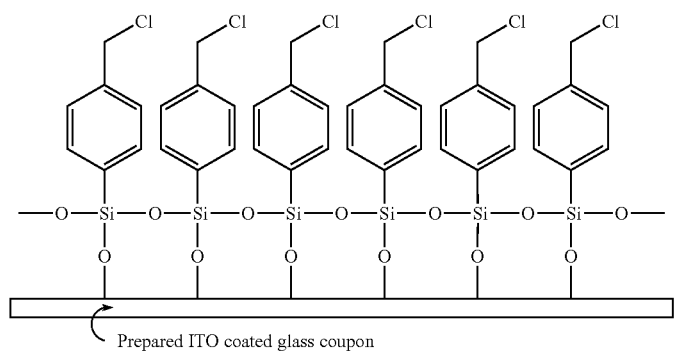
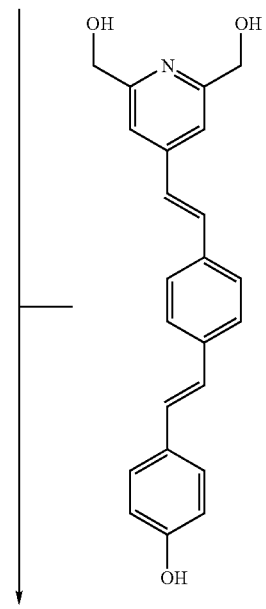

-continued

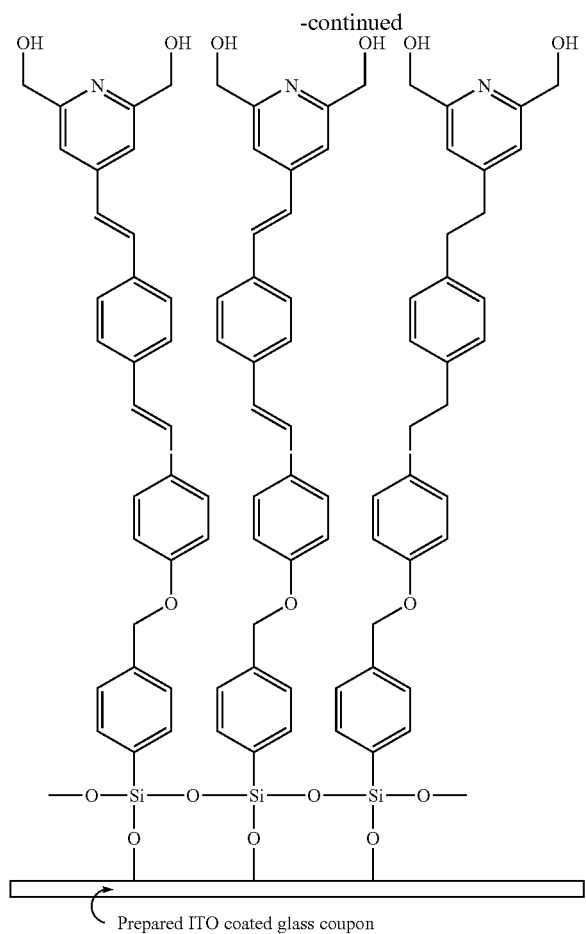

Using the methods described herein and methods known in the art, several devices were constructed and tested between 0 and 20V.

Reference Device Construction—Light Emitting Polymer

Figure 4A:
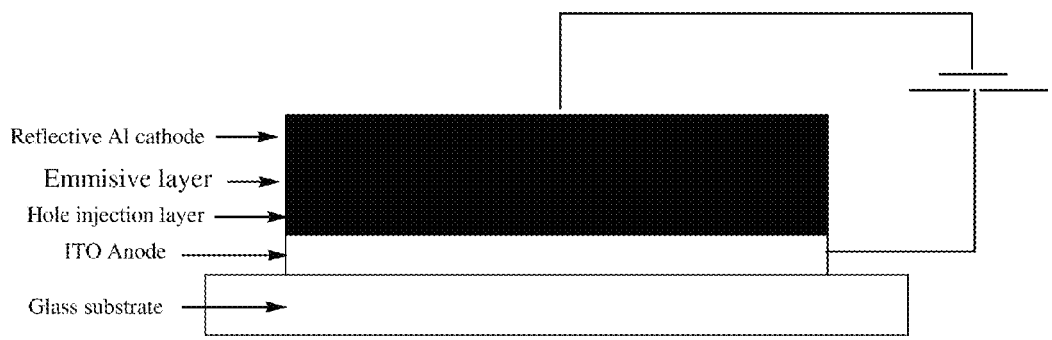
FIG. 4A shows the schematic of a LEP reference device.

In this example, shown in FIG. 4A, an exemplary light emitting polymer reference device was constructed by spin coating a solution of poly(3,4-ethylenedioxythiophene) (PEDOT) and polystyrene sulfonate (PSS), as the hole injection layer from chloroform (99 nm±5 nm) on a clean ITO coated glass substrate followed by the spin coating of poly(phenyl vinylene) (MEH-PPV) (99 nm±5 nm), as the emissive or conductive layer from chloroform and the chemical vapor deposition of 100 nm of magnesium:aluminum (10:1) as the cathode layer. Electrical connection was made to the anode (ITO) via an unexposed area of the test substrate and an electrical connection made to the cathode at the edge of the test substrate.

Test Device Construction—Light Emitting Polymer

Figure 4B:
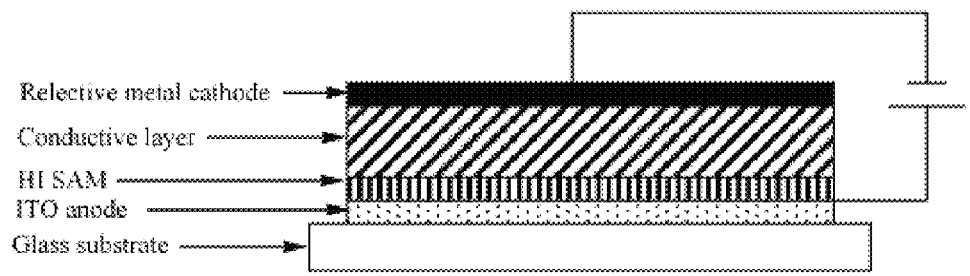
FIG. 4B shows the schematic of an exemplary LEP device of the invention.

This device is described in FIG. 4B. An ITO coated glass substrate comprising a hole-injection (HI) SAM layer prepared in accordance with the procedures described for the modification of the 4-chloromethyl phenylsiloxane self assembled monolayer with 4'-bromo[1,1'-biphenyl-4-ol] described earlier, was spin coated with an LEP layer such PFO-F8 or MEH-PPV, (the emissive or conductive layer) and the chemical vapor deposition of aluminum or calcium. The structure of PFO-F8 is shown below:

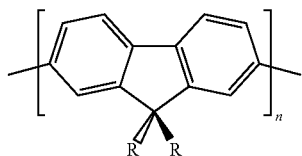

where R = 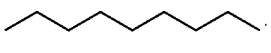

Other embodiments of PFO, such as F6 (R=a six carbon alkyl chain) and F2/6

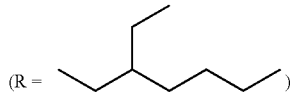

are included.

Reference Device Construction—Small Molecule Organic Light Emitting Diode

Figure 4C:
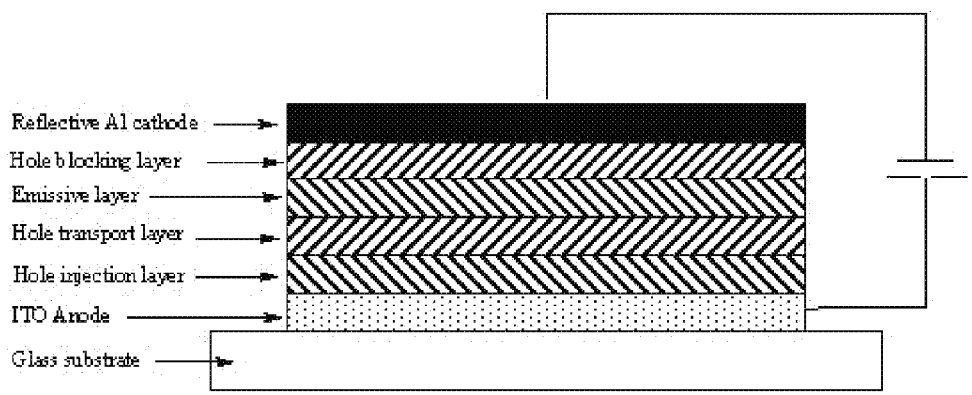
FIG. 4C shows the schematic of a small molecule organic light emitting diode device.

This device is described in FIG. 4C. An ITO coated glass substrate was spin coated with the desired SAM (hole injection layer), followed by chemical vapor deposition of NPB (N,N'-diphenyl-N,N'-bis(1-naphthyl)-1,1'-biphenyl-4,4''-diamine) (hole transport layer), followed by the chemical vapor deposition of $Alq_3$ (tris(8-hydroxyquinoline)aluminum) (emissive layer) and lithium fluoride (hole blocking layer). A 100 nm thick layer of Al was chemically vapor deposited on the surface.

Test Device (1) Construction—Small Molecule Organic Light Emitting Diode

Figure 5:
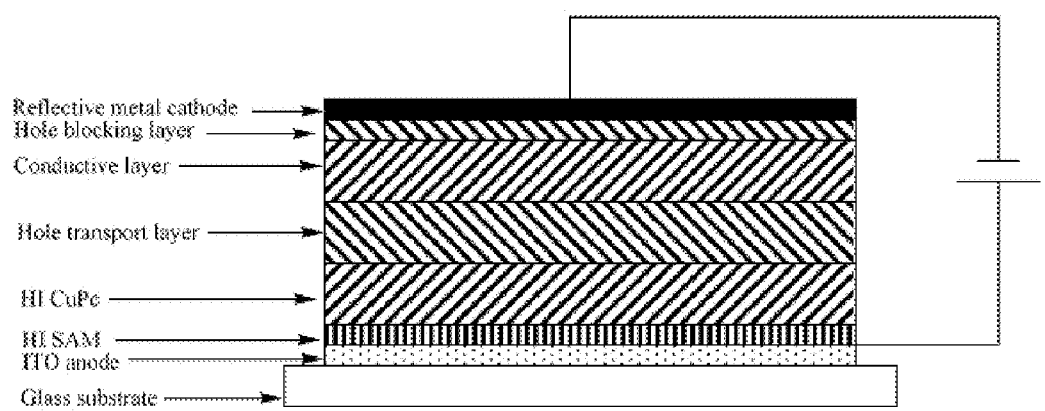
FIG. 5 shows the schematic of test device (1).

One exemplary test device structure comprised: a SAM of 2FDPA for example, 200 Å CuPc, 640 Å α-NPD as the hole transport layer, 520 Å $Alq_3$, as the emissive or conductive layer, 6 Å LiF, as the hole blocking layer and 1000 Å Al, as the reflective metal cathode. This adds a layer of CuPc, which is often referred to as a hole-injection layer; however, the primary effect is probably to improve wetting of the α-NPD to the ITO. This device is shown in FIG. 5.

Test Device (2) Construction—Small Molecule Organic Light Emitting Diode

Figure 6:
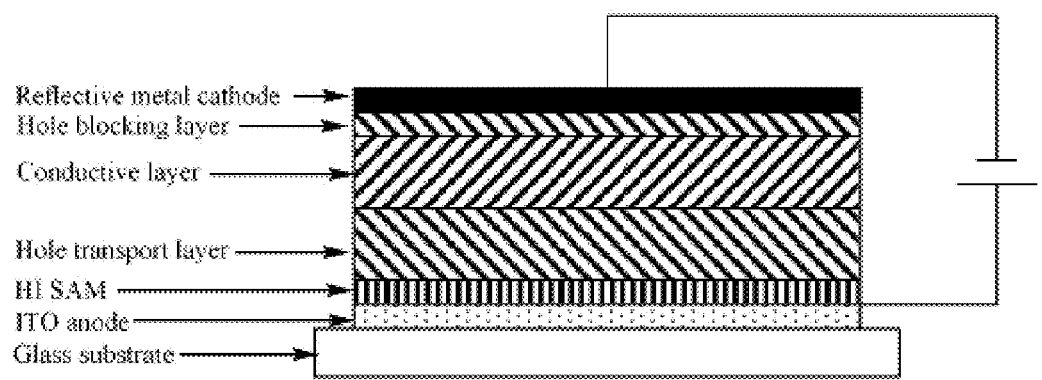
FIG. 6 shows the schematic of test device (2).
Figure 7:
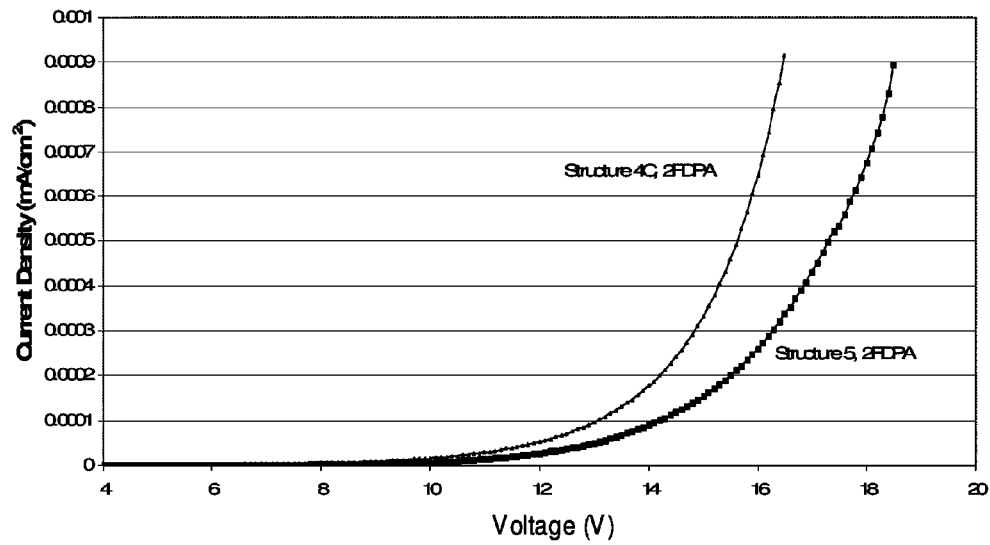
FIG. 7 shows the voltage versus current density for small molecule fluorescent test devices comprising 2FDPA using the device structures shown in FIGS. 4C and 5.
Figure 8:
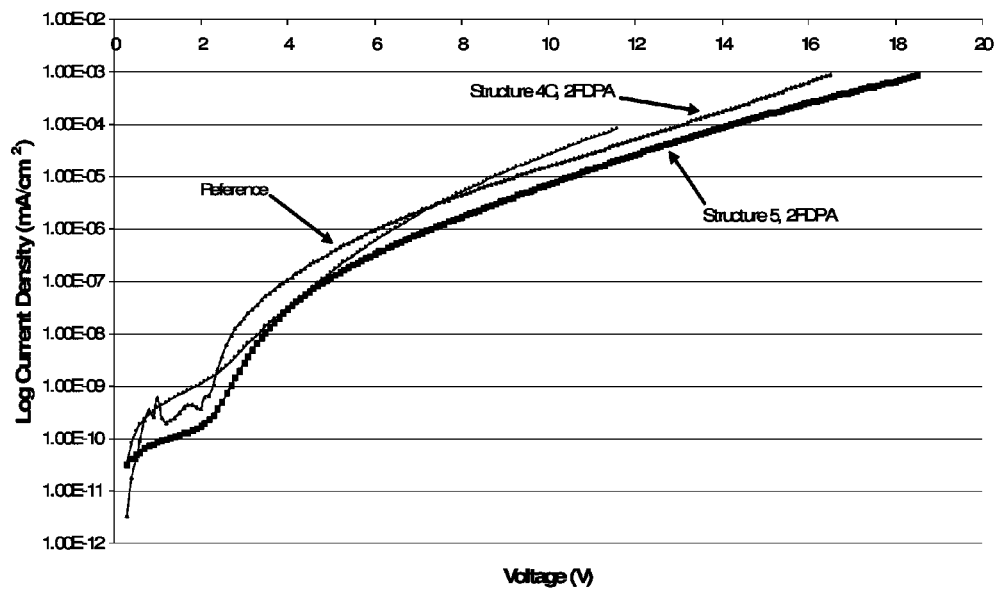
FIG. 8 shows the voltage versus log of current density for 2FDPA using the device structures shown in FIGS. 4C and 5.
Figure 9:
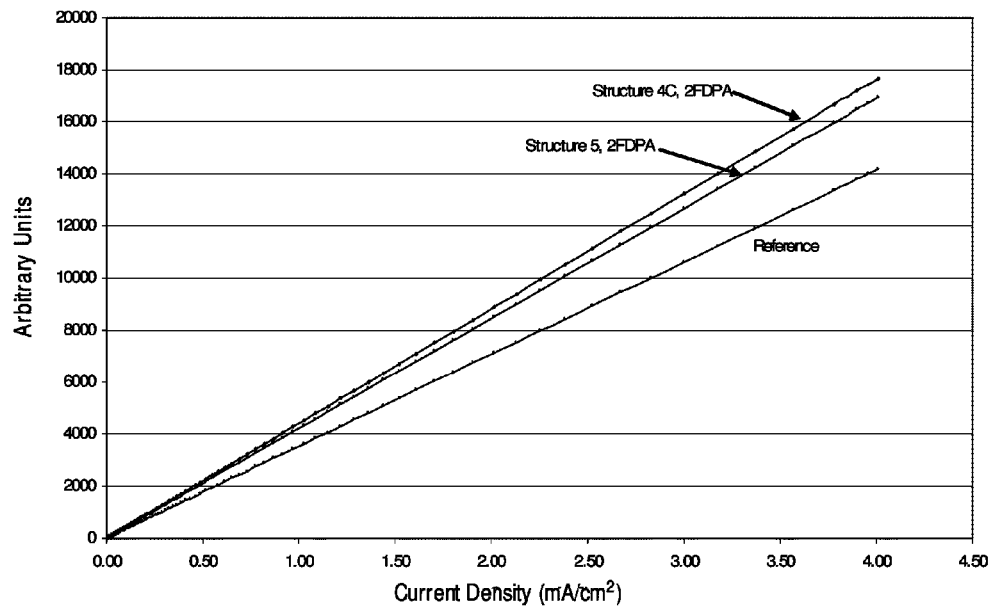
FIG. 9 shows current density versus luminance data for small molecule fluorescent test devices for 2FDPA using the device structures shown in FIGS. 4C and 5.
Figure 10:
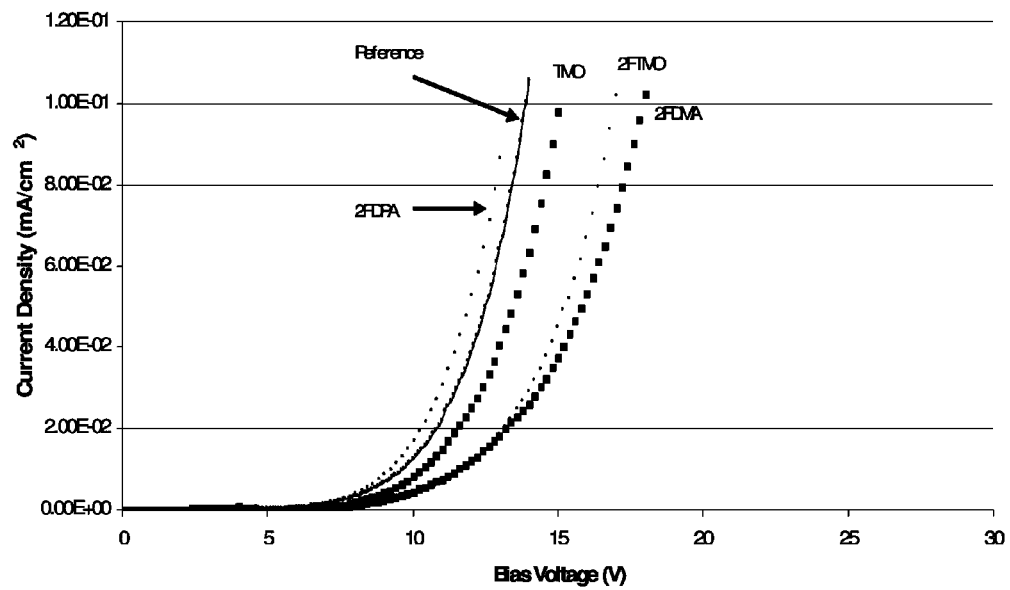
FIG. 10 shows voltage versus current density results for 2FDPA, TMO, 2FTMO and 2FDMA as the hole-injection SAM in conjunction with PFO-F8 as the emitter layer using the device structure shown in FIG. 4B.
Figure 11:
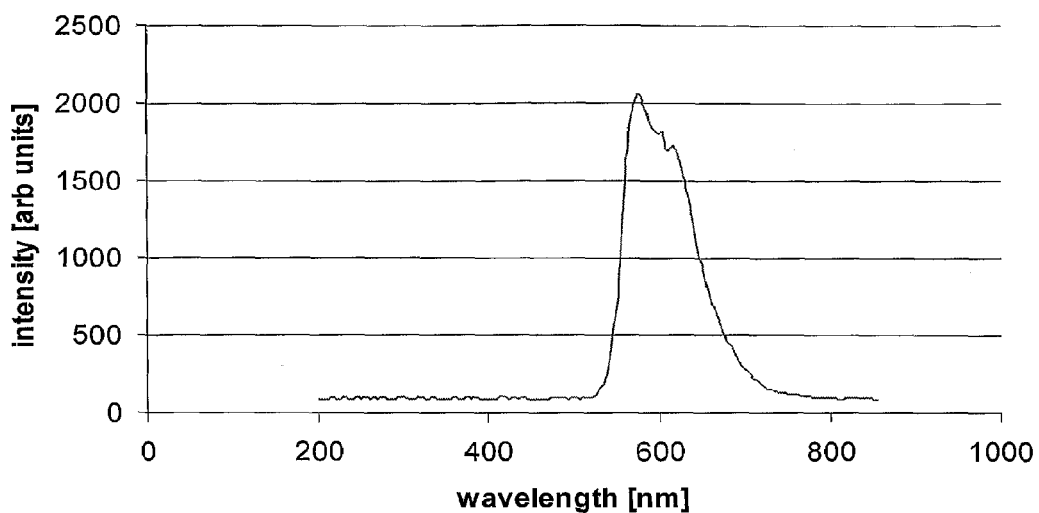
FIG. 11 shows the electroluminescent spectra for the LEP MEH-PPV using PDOT:PSS as the hole injection layer.
Figure 12:
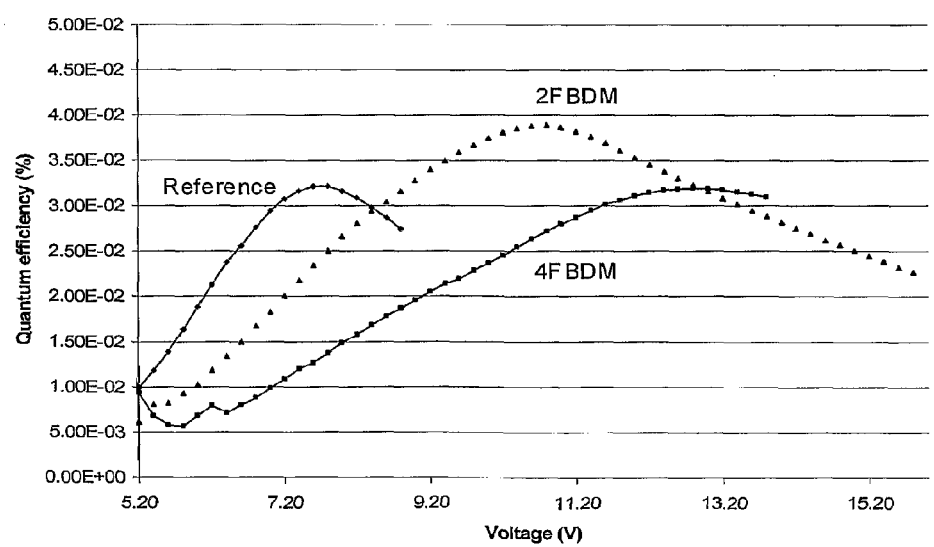
FIG. 12 shows the quantum efficiency of 2FBDM and 4FBDM in conjunction with MEH-PPV as the emitter layer using the device structure shown in FIG. 4B.
Figure 13:
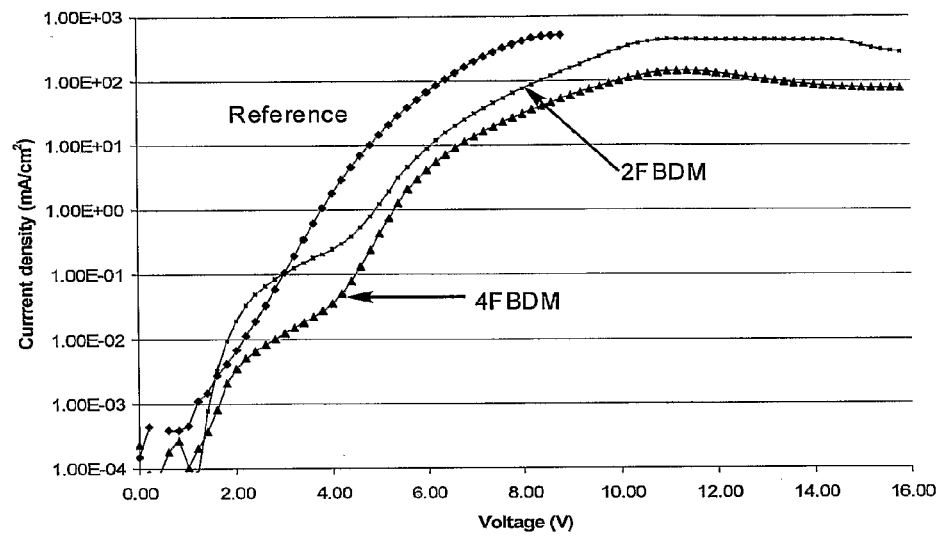
FIG. 13 shows the voltage versus current density for 2FBDM and 4FBDM in conjunction with MEH PPV as the emitter layer using the device structure shown in FIG. 4B.
Figure 14:
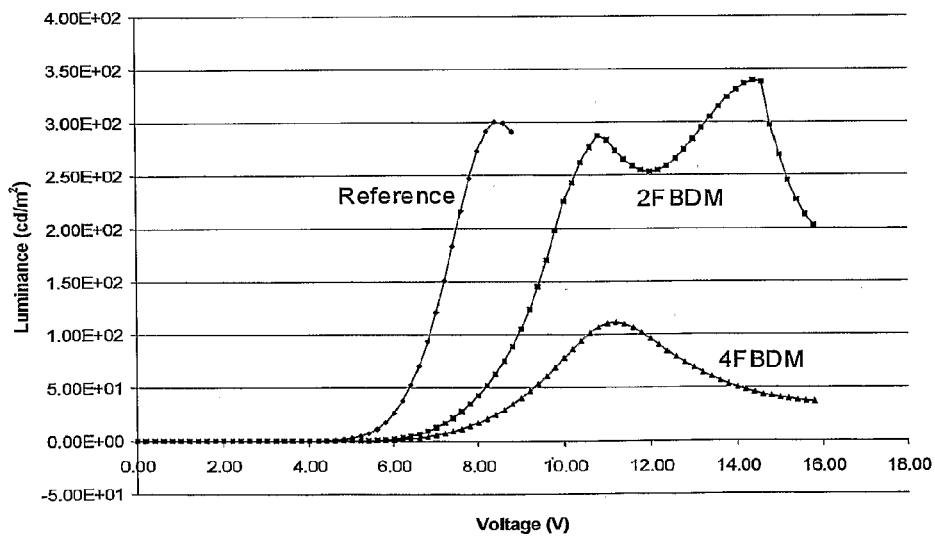
FIG. 14 shows the quantum efficiencies of test devices using 2FBDM and 4FBDM in conjunction with MEH PPV as the emitter layer using the device structure shown in FIG. 4B.
Figure 15:
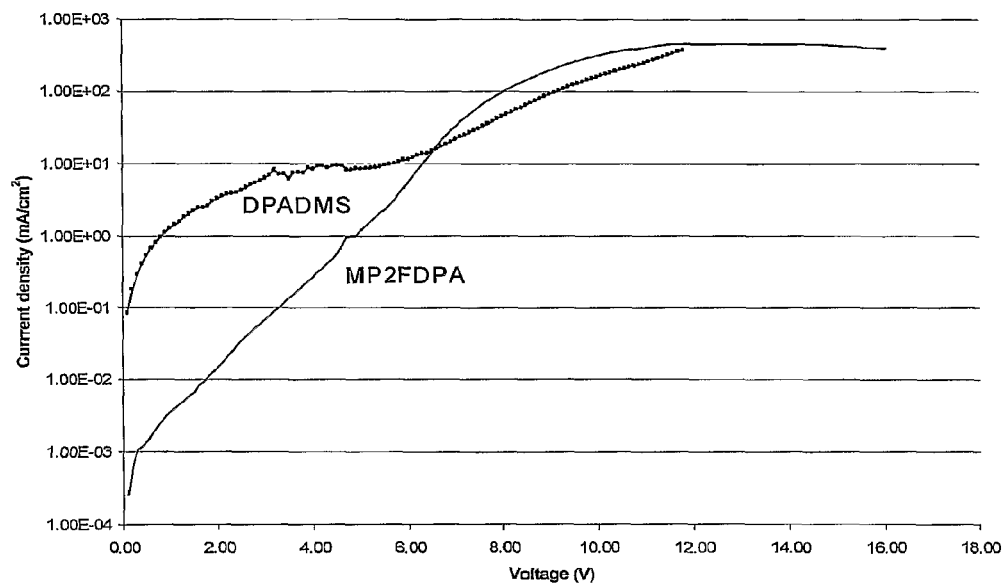
FIG. 15 shows voltage versus current density for test devices comprising DPADMS and MP2FDPA in conjunction with MEH-PPV as the emitter layer using the device structure shown in FIG. 4B.
Figure 16:
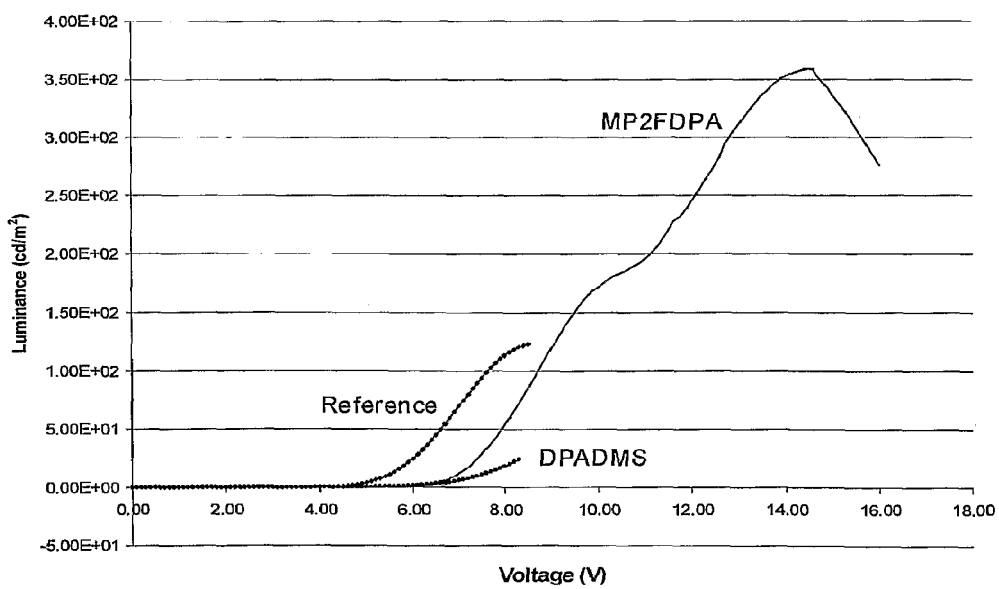
FIG. 16 shows voltage versus luminance results for test devices comprising DPADMS and MP2FDPA in conjunction with MEH-PPV as the emitter layer using the device structure shown in FIG. 4B.
Figure 17:
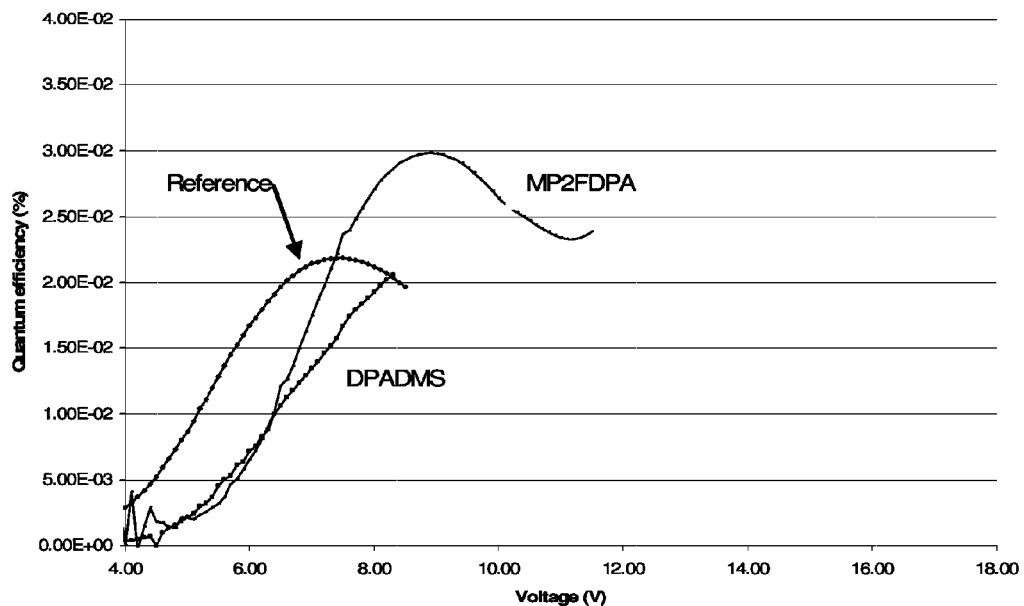
FIG. 17 shows quantum efficiency of DPADMS and MP2FDPA in conjunction with MEH-PPV as the emitter layer using the device structure shown in FIG. 4B.
Figure 18:
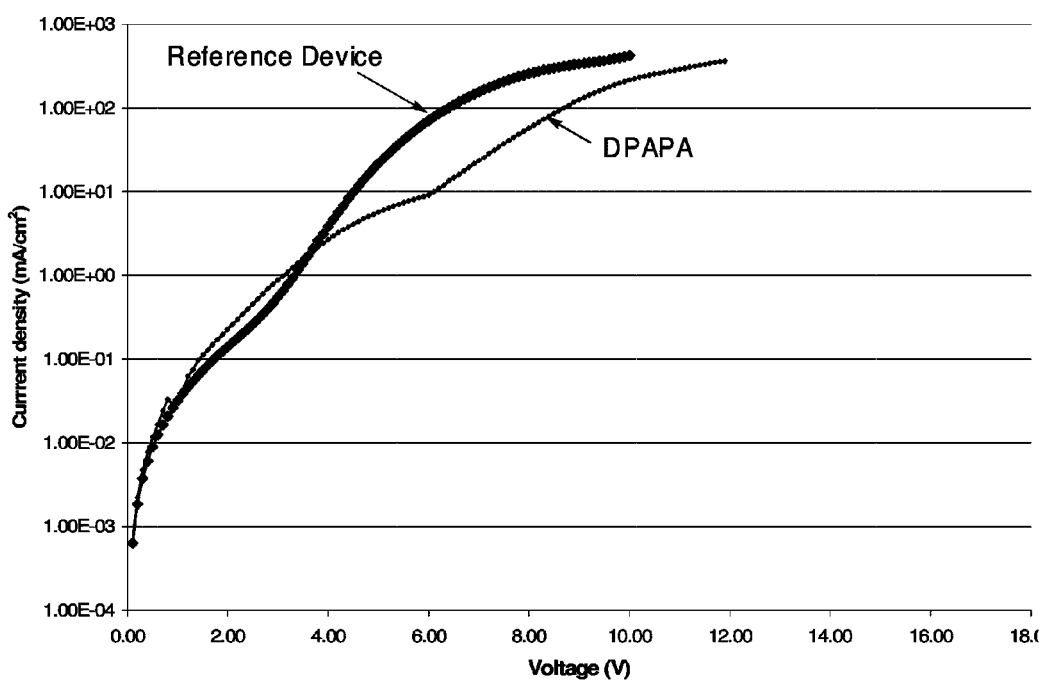
FIG. 18 shows voltage versus current density for DPAPA in conjunction with MEH-PPV as the emitter layer using the device structure shown in FIG. 4B.

The device structure comprised: a hole-injection SAM (for example a layer of 2FDPA), 640 Å -NPD as the hole transport layer, 520 Å $Alq_3$ as the emissive or conductive layer, 6 Å LiF as the hole blocking layer and 1000 Å Al as the reflective metal cathode. This device is shown in FIG. 6.

Organic Vapor Deposition (OVD) Conditions Description

Base pressure $6 \times 10^{-8}$ Torr, deposition pressure $<10^{-6}$ Torr. A vacuum break to the glovebox was applied (<1 ppm $O_2$, <1 ppm $H_2O$) between copper phthalocyanine (CuPc) and α-NPD (N-N'-bis-(1-naphthyl)-N,N'-diphenyl-1,1'-biphenyl-4,4'-diamine

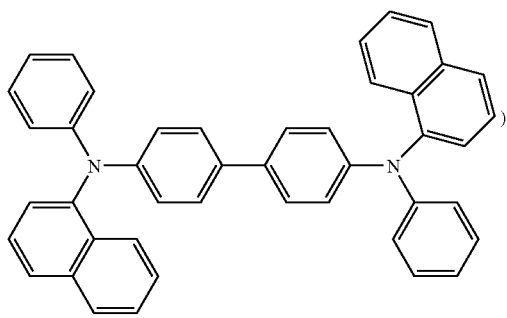

layers and $Alq_3$ and LiF layers. No patterning of organic layers was performed, cathodes were patterned into ~1 mm diameter dots using a stencil mask, as known in the art. Each of device 1 and device 2 were grown in parallel.

Devices were not encapsulated in these examples. L-I-V (luminance, current density (Amperes per $cm^{-2}$, voltage)) characteristics were measured immediately after removal from the glovebox using a Newport 835 UV-enhanced Si detector and Agilent 4155B semiconductor parameter analyzer. The first two I-V sweeps are discarded in order to eliminate forming effects and small nascent short circuits.

The results provided in FIGS. 7 through 18 exemplify the effectiveness of the various methodologies detailed here. Specifically, it can be seen in FIGS. 8, 9 and 10, that the incorporation of 2FDPA as a hole injection layer provides for an OLED device that produces more light as function of current density than a standard OLED device comprising CuPc as the hole injection layer. When combining both 2FDPA and CuPc in the same device, that device is more efficient than a standard reference device and further supports the efficacy of incorporating 2FDPA, as the method improves both hole injection and quantum efficiency. When utilized in an OLED device comprising an LEP as the emitter layer, it can be seen from FIGS. 11 through 18 that the approach results in an effective OLED device, that is capable of high brightness at low voltages. The incorporation of the structures provided results in improved I-V characteristics in some circumstances and improved quantum efficiencies in others and clearly demonstrates the efficacy of the approach as an alternative hole injection methodology for use in LEP devices when compared LEP devices comprising PDOT:PSS as the hole injection layer.

For the devices (1) and (2), the total thickness of the HI SAM MEH-PPV was 99 nm ±5 nm. The structure of MEH-PPV is:

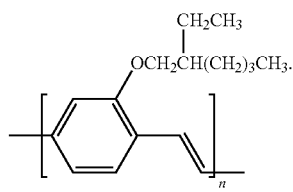

The light emitting polymer layer Baytron P (also called PDOT:PSS ([poly(3,4-ethylenedioxythiophene):poly(styrene sulfonate)]) was determined as 198±10 nm for device 1 and 194±11 nm for device 2. Cathode material was Mg:Ag (10:1)

Multi-Part System

Scheme 19 illustrates an example of the first step of a multi-part system where a second portion of the SAM can be added to the first portion of the SAM, instead of the addition of a LEP.

Scheme 19
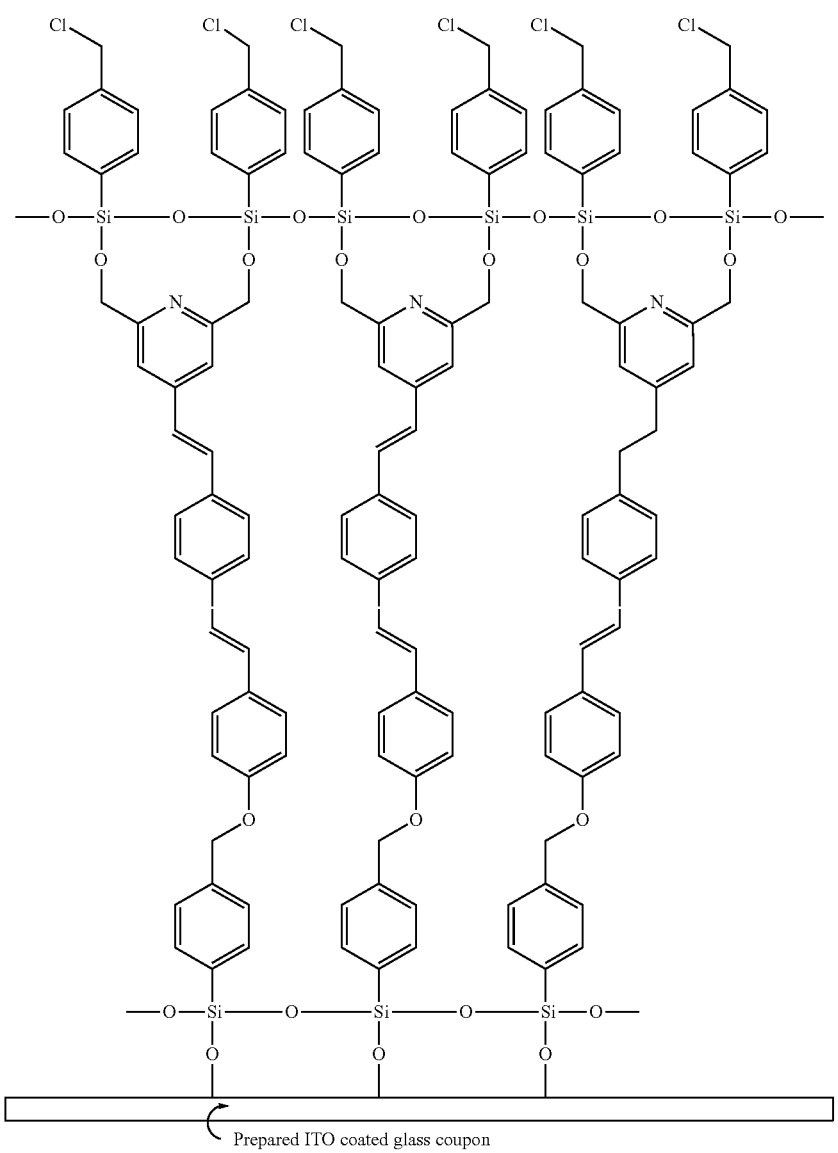
Scheme 20 shows the second step of the preparation of a multi-part system.
Scheme 20. The deposition of a multi-part SAM
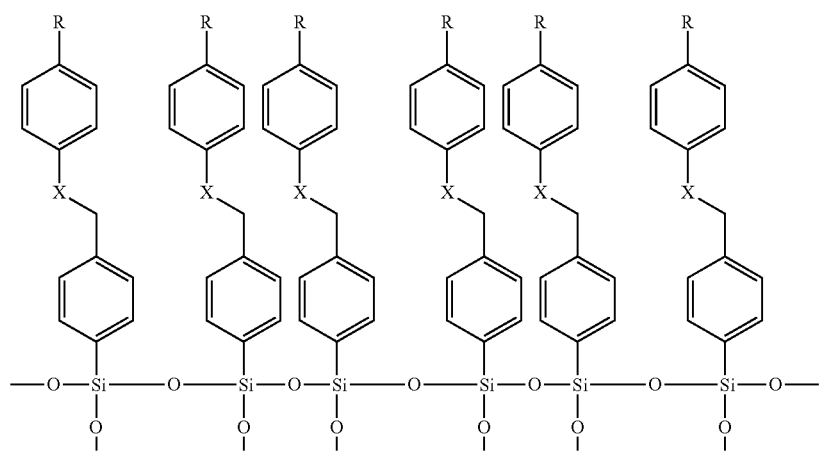

-continued
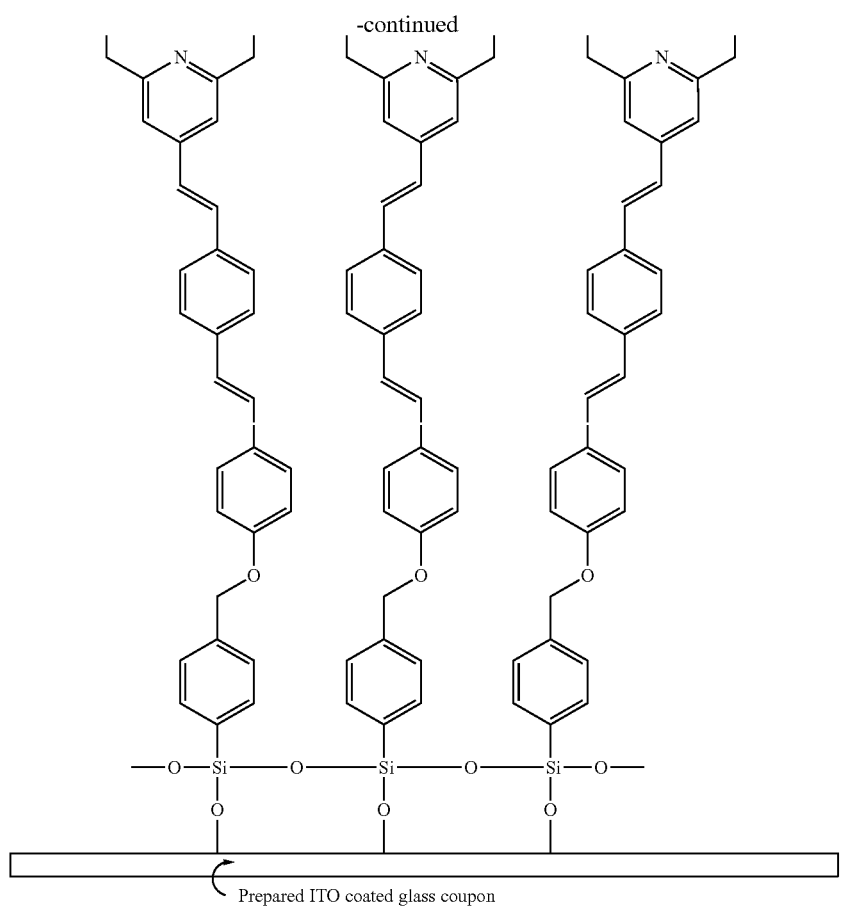
Where X is O, NH, or CH2
Scheme 21 shows one example of doping the system (for example, by using 4F-TCNQ) to the multi-part system.
Scheme 21. The doping of a multi-part SAM (MP-2FDPA) using 4F-TCNQ
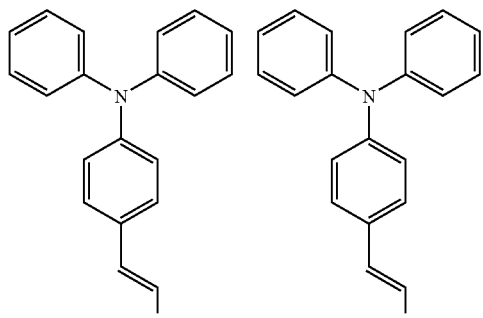

-continued
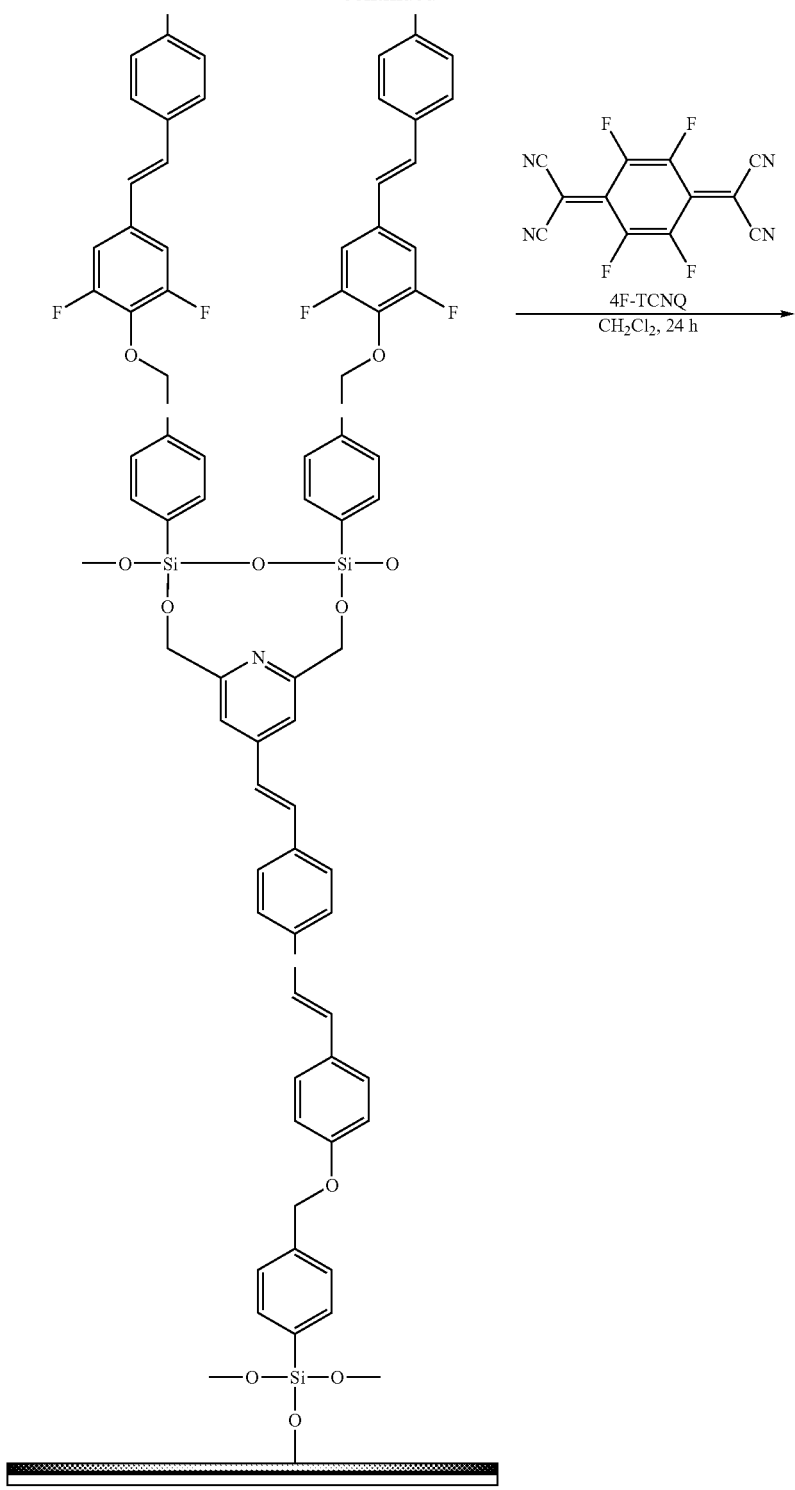
Prepared ITO coated glass substrate

Specific Examples of SAM Deposition Schemes:
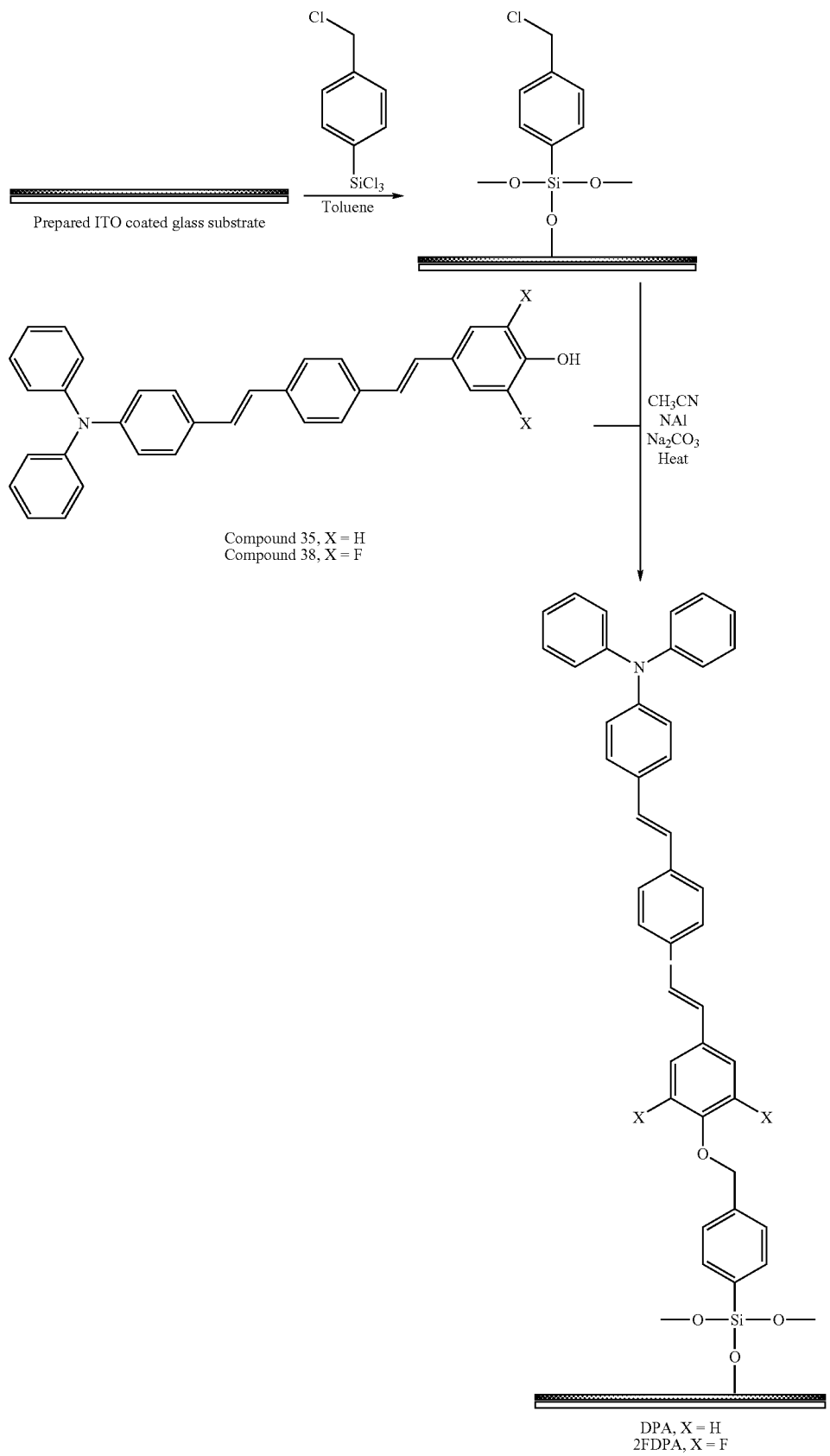

Scheme 23. The deposition of DMA and 2FDMA
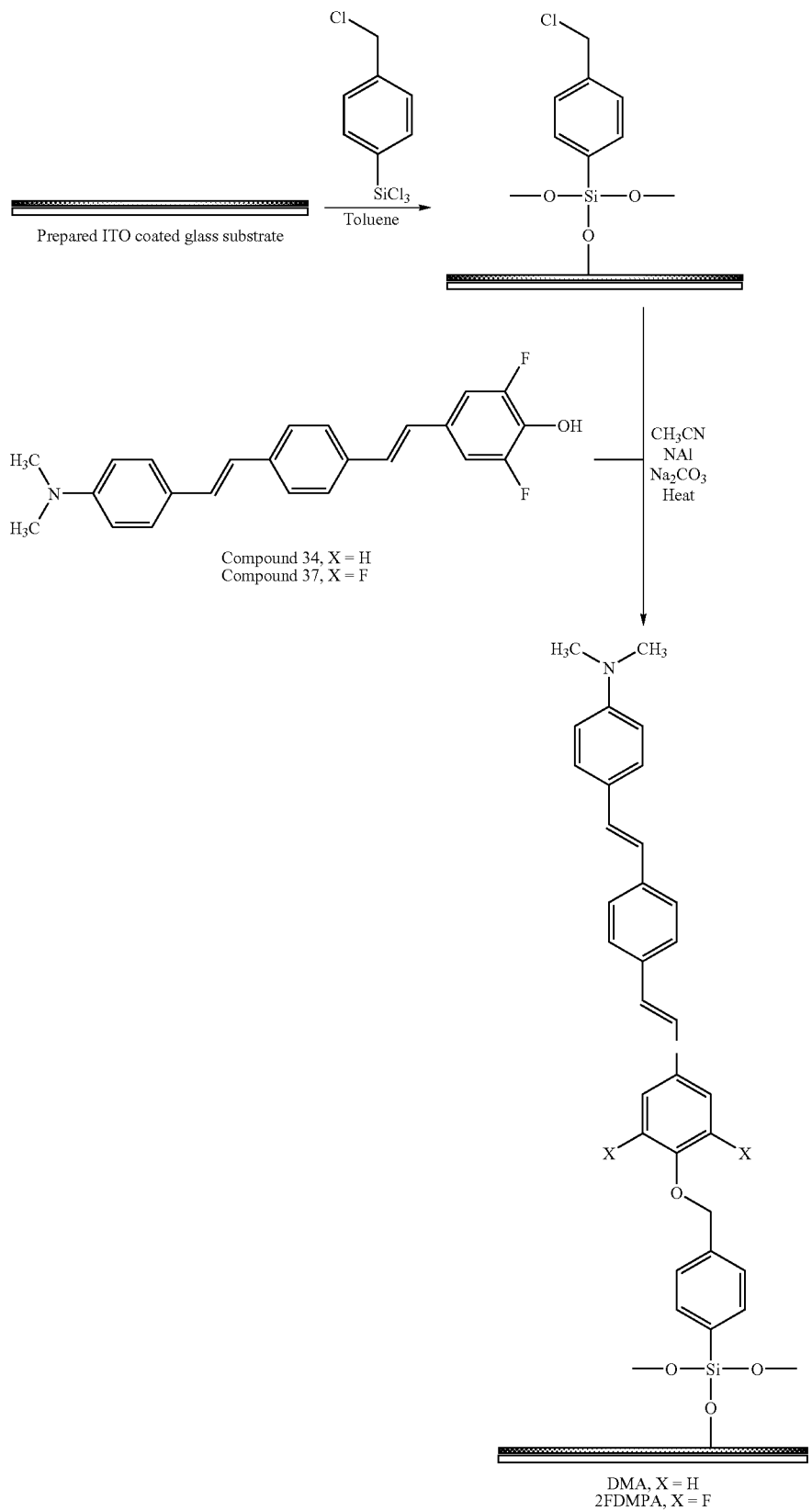
Compound 34, X = H
Compound 37, X = F
DMA, X = H
2FDMPA, X = F

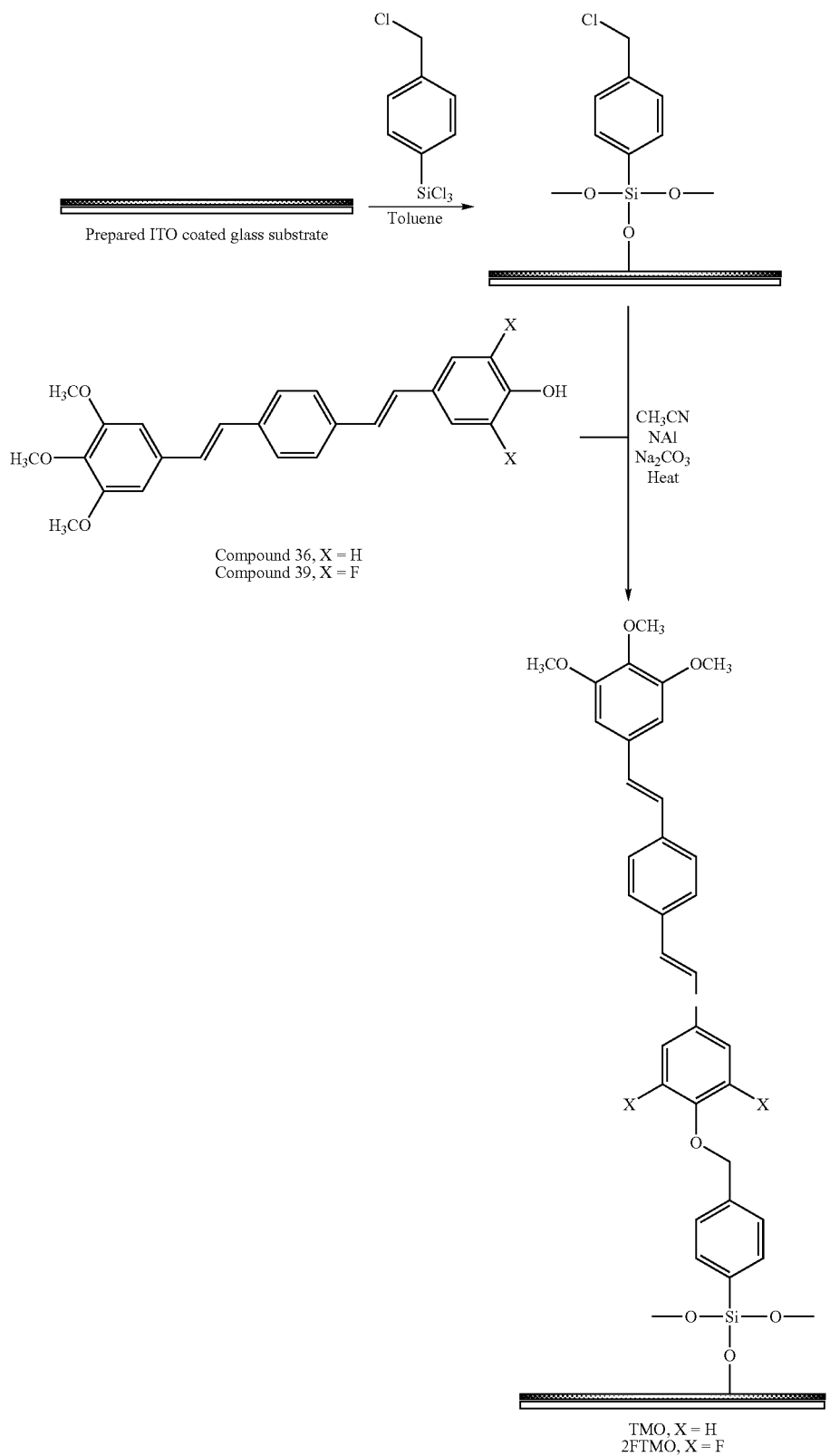

Scheme 25. The deposition of 2FBDM
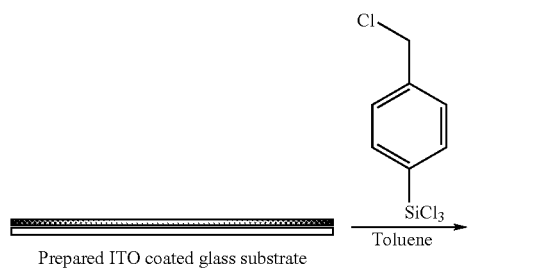
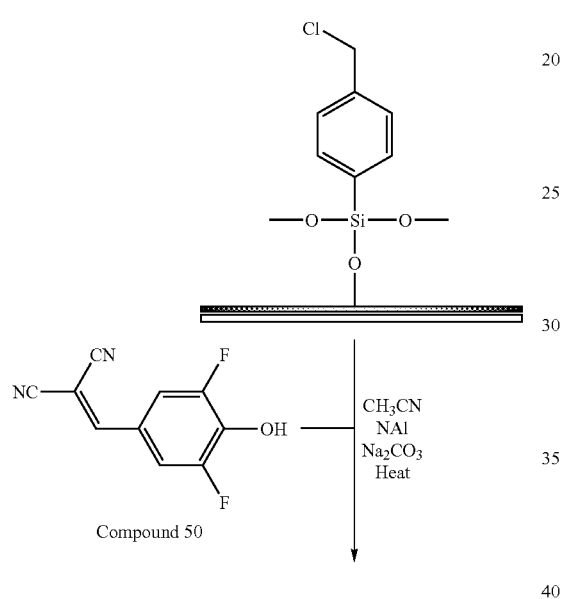
Compound 50
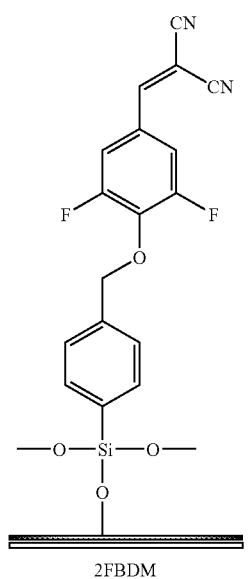
2FBDM
Scheme 26. The deposition of 4FBDM
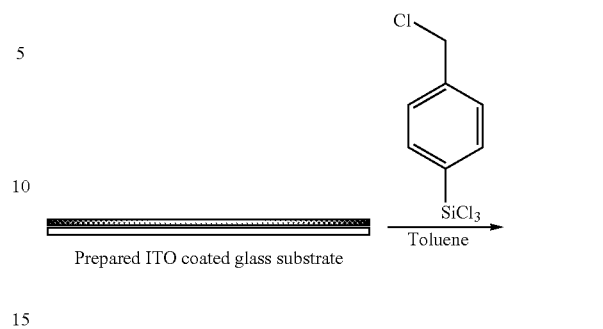
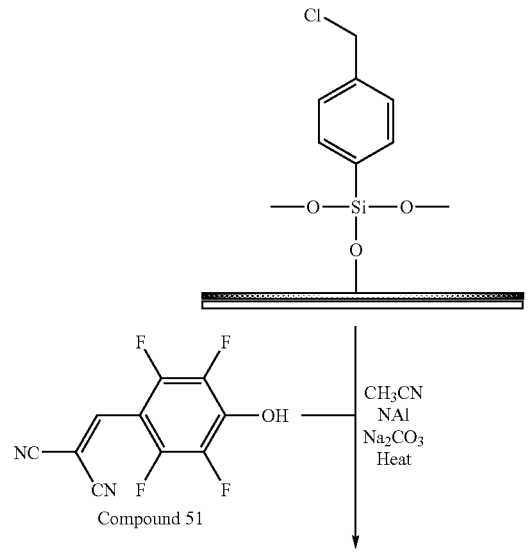
Compound 51
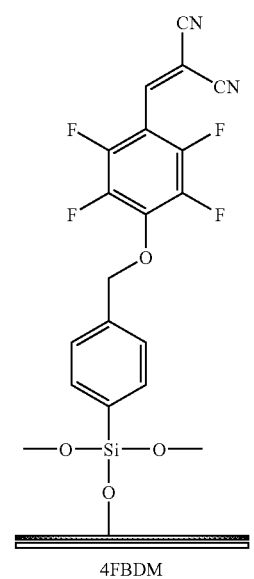
4FBDM Scheme 27. The deposition of BDM
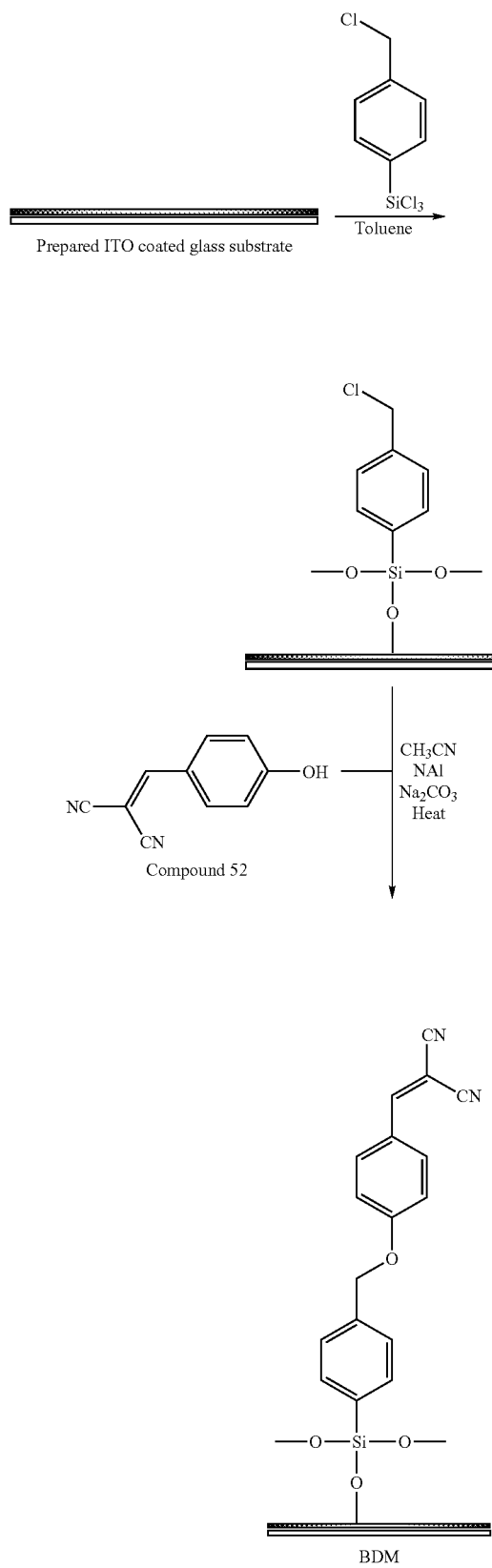
Scheme 28. The deposition of DPADMS
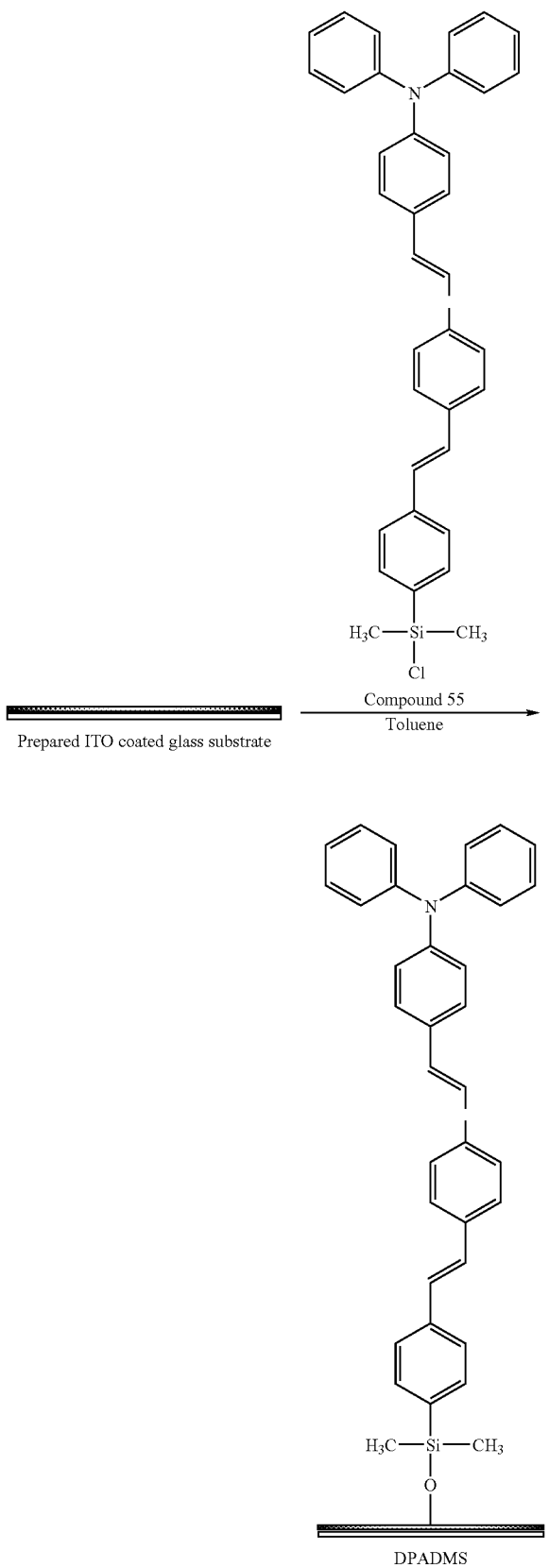

Scheme 29. The deposition of DPAPA

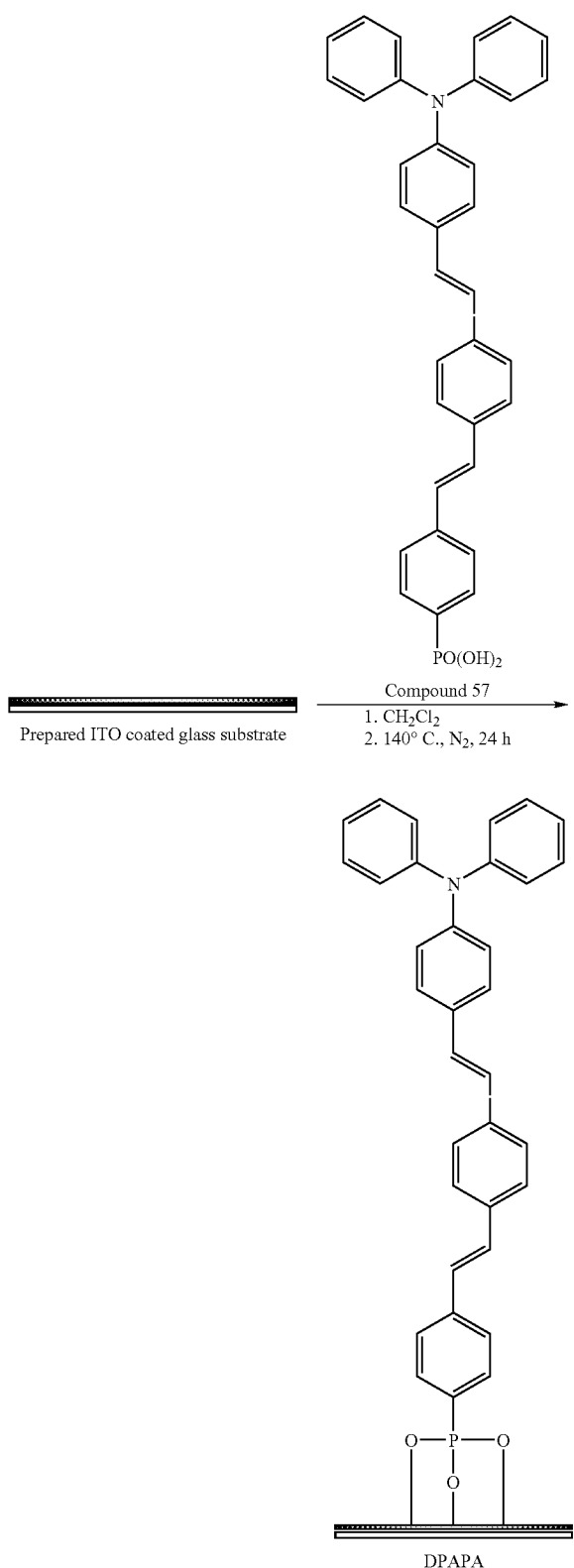

One skilled in the art will readily appreciate that the present invention is well adapted to carry out the objects and obtain the ends and advantages mentioned, as well as those inherent therein. The compounds, materials, methods and accessory methods described herein as presently representative of preferred embodiments are exemplary and are not intended as limitations on the scope of the invention. Changes therein and other uses will occur to those skilled in the art, which are encompassed within the spirit and scope of the invention.

Although the description herein contains many specificities, these should not be construed as limiting the scope of the invention, but as merely providing illustrations of some of the embodiments of the invention. Thus, additional embodiments are within the scope of the invention and within the scope of the claims. All references cited herein are hereby incorporated by reference to the extent that there is no inconsistency with the disclosure of this specification. Some references provided herein are incorporated by reference herein to provide details concerning additional starting materials, additional methods of synthesis, additional methods of analysis and additional uses of the invention. All patents and publications mentioned in the specification are indicative of the levels of skill of those skilled in the art to which the invention pertains.

When a group of substituents is disclosed herein, it is understood that all individual members of those groups and all subgroups, including any isomers and enantiomers of the group members, and classes of compounds that can be formed using the substituents are disclosed separately and are intended to be included in the disclosure separately and capable of exclusion in the disclosure separately. When a compound or composition is claimed or included in a claim, it should be understood that compounds or compositions known in the art including the compounds and compositions disclosed with an enabling disclosure in the references disclosed herein and those known in the art are not intended to be included and each such compound or composition disclosed in a reference may be excluded separately. When a Markush group or other grouping is used herein, all individual members of the group and all combinations and sub-combinations possible of the group are intended to be individually included in the disclosure. All possible different groupings and combinations of each component are intended to be disclosed and capable of exclusion as if they were individually disclosed.

Every formulation or combination of components described or exemplified can be used to practice the invention, unless otherwise stated. Specific names of compounds are intended to be exemplary, as it is known that one of ordinary skill in the art can name the same compounds differently. When a compound is described herein such that a particular isomer or enantiomer of the compound is not specified, for example, in a formula or in a chemical name, that description is intended to include each isomer and enantiomer of the compound described individual or in any combination. One of ordinary skill in the art will appreciate that methods, device elements, starting materials, synthetic methods, materials and compounds used in construction of the device and connection of the device to electrical power other than those specifically exemplified can be employed in the practice of the invention without resort to undue experimentation. All art-known functional equivalents, of any such methods, device elements, starting materials, synthetic methods, materials and compounds used in construction of the device and connection of the device to electrical power are intended to be included in this invention. Whenever a range is given in the specification, for example, a temperature range, a time range, or a composition range, all intermediate ranges and subranges, as well as all individual values included in the ranges given are intended to be included in the disclosure. Components other than those specifically listed, for example, other layers, may be used in the device, as known in the art.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

In general the terms and phrases used herein have their art-recognized meaning, which can be found by reference to standard texts, journal references and contexts known to those skilled in the art. The specific definitions provided are intended to clarify their specific use in the context of the invention.

REFERENCES

1. Burroughes, J. H. et al, *Nature*, 1990, 347, 539-541
2. Gill, R. E., et al, *Optical Materials*, 1999, 12, 183-187
3. SID 2002 Advance Program, http://www.sid.org/conf/sid2002/sid2003.html
4. Braun, D., *Materials Today*, June 2002, 32-39
5. Calvert, P., *Chem. Mater.*, 2001, 13, 3299-3305
6. Tang, C. W. and Van Slyke, S. A., *App. Phys. Lett.* (1987) 51, 913-915
7. Kafafi, Z. et al, *Optoelectronic Materials*, 2003, 4, 113-121
8. Kondackov, *J. App. Phys.*, 2003, 93, 1108
9. Baldo, M. A. et al, *Nature* 1998, 395, 151
10. Forrest, S. R., et al, *Phys. Rev. B.*, 1999, 60, 14422
11. Omary, M. A., et al, *Inorganic Chemistry*, 2003, 42, No. 7, 2176-2178
12. Sheats, J. R., *J. Mater. Res.*, 2004, 19, No. 7, 1974-1989
13. Braun, D. and Heeger, A. J., *A. J. Appl. Phys. Lett.*, 1991, 58, 1982-1984
14. Brédas, J-L., et al, *Paper No. POLY 395*, Presented at the 227th American Chemical Society National Meeting, Anaheim, Calif., 2004
15. Lane, P. A. et al, *Phys. Rev. B*, 2001, 63, 235206
16. Sugimoto, A. et al, *IEEE Journal Of Selected Topics In Quantum Electronics*, 2004, 10, No. 1, 107-114
17. Parker, I. D., Cao, Y. and Yang, C. Y., *J. Appl. Phys.*, 1999, 85, No. 4, 2441-2447
18. Parker, I. D., *J. Appl. Phys.*, 1994, 75, No. 3, 1656-1666
19. Carrard, M. et al, *Thin Solid Films*, 1999, 352, 189-194
20. Appleyard. et al, *J. Mater. Chem.*, 2000, 10, 169-173
21. Malinksy., et al, *Chem. Mater.*, 2002, 14, 3054-3065
22. Hatton et al, *J. Mater. Chem.*, 2003, 13, 38-43
23. Cui, et al, *Adv. Mater.*, 2002, 14. No. 8, 565-569
24. Marks, T. J., et al, U.S. Pat. No. 5,834,100, November 1998.

U.S. Pat. Nos. 6,169,163; 5,306,572; EP0861845; U.S. Pat. Nos. 6,399,221; 6,878,468; US2005/0147846; U.S. Pat. No. 6,586,763; US2005/0158579; Yan, Adv. Mater. 2003, 15 (10), 835-838; WO03/079732; US2005/0260443; US2005/0234256; US2005/0285101; US2005/0280604; U.S. Pat. Nos. 5,409,783; 6,939,625; 6,855,274; 5,156,918; US2005/0127337.

We claim:

1. A light emitting device comprising:

a transparent substrate;

a layer of conducting material in contact with the transparent substrate;

a self-assembled monolayer bonded to the layer of conducting material;

a light emitting polymer layer in electron contact to the self-assembled monolayer; and a reflective metal layer in electron contact with the light emitting polymer layer.

2. The light emitting device of claim 1, further comprising a voltage source connected to the conducting material and reflective metal layer.

3. The light emitting device of claim 1, wherein the light emitting polymer layer comprises one or more different light emitting polymers.

4. The light emitting device of claim 1, wherein the light emitting polymer layer comprises different light emitting polymers which each emit a different wavelength of light.

5. The light emitting device of claim 1, wherein the self-assembled monolayer has the following structure:

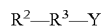

where Y is a group capable of electron contact with a light emitting polymer, $R^3$ contains a conjugated group, and $R^2$ is a group capable of bonding to a conducting material.

6. The light emitting device of claim 5, wherein $R^2$ contains a silicon bond that is used to bond to the conducting material.

7. The light emitting device of claim 6, wherein $R^2$ comprises a phenylsilane.

8. The light emitting device of claim 6, wherein $R^2$ comprises:

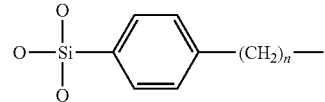

where n is an integer from 0 to 6, wherein one or more adjacent or nonadjacent $CH_2$ groups may be replaced with a heteroatom, and wherein one or more hydrogens in the $CH_2$ groups may be replaced with a halogen or —OH group.

9. The light emitting device of claim 5, wherein $R^3$ has the formula:

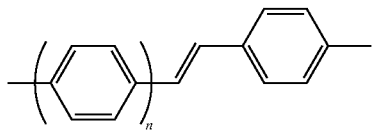

where n is an integer from 0 to 10.

10. The light emitting device of claim 9, wherein n is 2.

11. The light emitting device of claim 5, wherein Y is selected from the group consisting of: hydrogen; halogen; cyano; nitro; R; —OR; —NR$_2$; -and —SR$_2$; where each R is independently hydrogen or a straight chain or branched alkyl or alkenyl group with from one to 25 carbon atoms, wherein one or more carbon atoms may be optionally independently replaced with O or N, and wherein R may include one or more optional halogen substituents.

12. The light emitting device of claim 1, wherein the self-assembled monolayer is selected from the group consisting of: DPA, 2FDPA, DMA, 2FDMA, TMO, 2FTMO, 2FBDM, 4FBDM, BMD, DPADMS, and DPAPA.

13. The light emitting device of claim 1, wherein the light emitting polymer layer is selected from the group consisting of: MEH-PPV and PFO-F8.

14. A method of producing light comprising applying voltage to the device in claim 1.

15. A self-assembled monolayer having the formula:

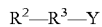

where Y is a group capable of electron contact with a light emitting polymer, $R^3$ contains a conjugated group, and $R^2$ is a group capable of bonding to a conducting material.

16. The self-assembled monolayer of claim 15, wherein $R^2$ contains a silicon bond that is used to bond to the conducting material.

17. The self-assembled monolayer of claim 16, $R^2$ comprises a phenylsilane.

18. The self-assembled monolayer of claim 15, wherein $R^2$ comprises:

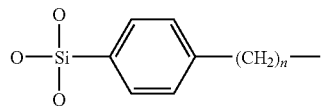

where n is an integer from 0 to 6, wherein one or more adjacent or nonadjacent CH$_2$ groups may be replaced with a heteroatom, and wherein one or more hydrogens in the CH$_2$ groups may be replaced with a halogen or —OH group.

19. The self-assembled monolayer of claim 15, wherein $R^3$ has the formula:

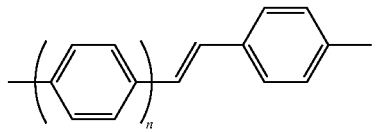

where n is an integer from 0 to 10.

20. The self-assembled monolayer of claim 15, wherein Y is selected from the group consisting of: hydrogen; halogen; cyano; nitro; R'; —OR'; —NR'$_2$; -and SR'$_2$; where each R' is independently hydrogen or a straight chain or branched alkyl or alkenyl group with from one to 25 carbon atoms, wherein one or more carbon atoms may be optionally independently replaced with O or N, and wherein R' may include one or more optional halogen substituents.

21. The self-assembled monolayer of claim 15, wherein R3 has the formula:

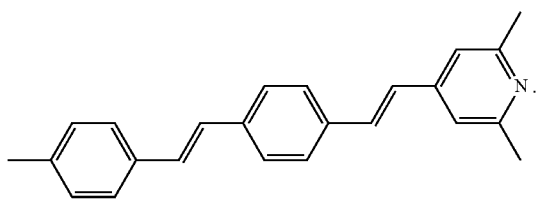

22. The self-assembled monolayer of claim 15 having the formula:

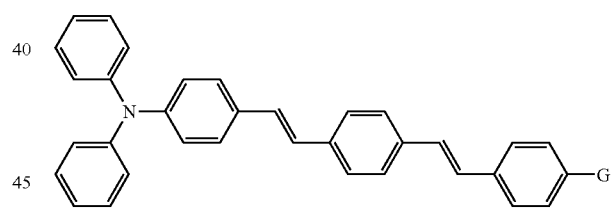

wherein G is either a silicon-containing group capable of bonding to a conducting material or a phosphorous-containing group capable of bonding to a conducting material or a sulfur-containing group capable of bonding to a conducting material.

* * * * *